United States Patent
Kim et al.

(10) Patent No.: US 10,910,333 B2
(45) Date of Patent: *Feb. 2, 2021

(54) DISPLAY DEVICE

(71) Applicant: Samsung Display Co., Ltd., Yongin-si (KR)

(72) Inventors: Sujeong Kim, Asan-si (KR); Hanho Park, Yongin-si (KR); Sangwon Yeo, Cheonan-si (KR); Daegeun Lee, Hwaseong-si (KR); Joonsam Kim, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/535,696

(22) Filed: Aug. 8, 2019

(65) Prior Publication Data

US 2019/0363061 A1    Nov. 28, 2019

Related U.S. Application Data

(63) Continuation of application No. 15/619,526, filed on Jun. 11, 2017, now Pat. No. 10,410,987.

(30) Foreign Application Priority Data

Aug. 2, 2016 (KR) .................. 10-2016-0098644

(51) Int. Cl.
*H01L 23/00* (2006.01)
*G02F 1/1345* (2006.01)
(Continued)

(52) U.S. Cl.
CPC .......... *H01L 24/06* (2013.01); *G02F 1/13458* (2013.01); *H01L 27/323* (2013.01);
(Continued)

(58) Field of Classification Search
CPC ... H01L 24/06; H01L 27/323; H01L 27/3255; H01L 27/3276; H01L 51/0097;
(Continued)

(56) References Cited

U.S. PATENT DOCUMENTS 9,591,754 B2    3/2017 Lee
2009/0027366 A1*  1/2009 Kim .................... G09G 3/3685
                                                345/204

(Continued)

FOREIGN PATENT DOCUMENTS

EP            2957951         12/2015
KR      10-2004-0052578        4/2004
(Continued)

OTHER PUBLICATIONS

Extended European Search Report dated Jan. 10, 2018, issued in the European Patent Application No. 17184348.5.
(Continued)

*Primary Examiner* — Mohammad M Hoque
(74) *Attorney, Agent, or Firm* — H.C. Park & Associates, PLC

(57) ABSTRACT

A display device including a display panel including a base layer, a circuit layer disposed on the base layer, and a pad part having a plurality of pads disposed on the base layer; and a driving chip disposed on the pad part and including a plurality of chip pads. The plurality of pads include a first pad having a smaller area than a corresponding chip pad among the plurality of chip pads and a second pad electrically connected to the circuit layer.

21 Claims, 18 Drawing Sheets

(51) Int. Cl.
    *H01L 27/32*     (2006.01)
    *H01L 51/00*     (2006.01)
    *H05K 1/11*          (2006.01)
    *G06F 3/044*         (2006.01)
(52) U.S. Cl.
    CPC ...... *H01L 27/3255* (2013.01); *H01L 27/3276* (2013.01); *H01L 51/0097* (2013.01); *G06F 3/044* (2013.01); *H01L 2224/0217* (2013.01); *H01L 2224/0603* (2013.01); *H01L 2224/0605* (2013.01); *H01L 2224/06132* (2013.01); *H01L 2251/5338* (2013.01); *H01L 2924/12044* (2013.01); *H05K 1/111* (2013.01); *H05K 2201/09409* (2013.01); *H05K 2201/10128* (2013.01)
(58) Field of Classification Search
    CPC ..... H01L 2224/0217; H01L 2224/0603; H01L 2224/0605; H01L 2224/06132; H01L 2251/5338; H01L 2924/12044; H01L 23/544; H01L 27/3244; H01L 2223/54426; H01L 23/49503–49513; G02F 1/13458; H05K 1/111; H05K 2201/09409; H05K 2201/10128; G06F 3/044
    USPC ......................................................... 257/40
    See application file for complete search history.

(56) References Cited

U.S. PATENT DOCUMENTS

| | | | |
|---|---|---|---|
| 2010/0214728 | A1 | 8/2010 | Aoyagi et al. |
| 2014/0124803 | A1* | 5/2014 | Kwack .............. H01L 24/06 257/91 |
| 2015/0187803 | A1* | 7/2015 | Moh .............. H01L 27/124 257/43 |
| 2017/0196080 | A1* | 7/2017 | Meng .............. H05K 1/181 |
| 2018/0047314 | A1* | 2/2018 | Chen .............. H01L 21/77 |

FOREIGN PATENT DOCUMENTS

| | | |
|---|---|---|
| KR | 2007-0007633 | 1/2007 |
| KR | 10-1399973 | 6/2014 |
| KR | 10-2015-0144907 | 12/2015 |
| KR | 10-2016-0002151 | 1/2016 |

OTHER PUBLICATIONS

Non-Final Office Action dated Nov. 13, 2018, in U.S. Appl. No. 15/691,526.

Notice of Allowance dated May 2, 2019, in U.S. Appl. No. 15/691,526.

* cited by examiner

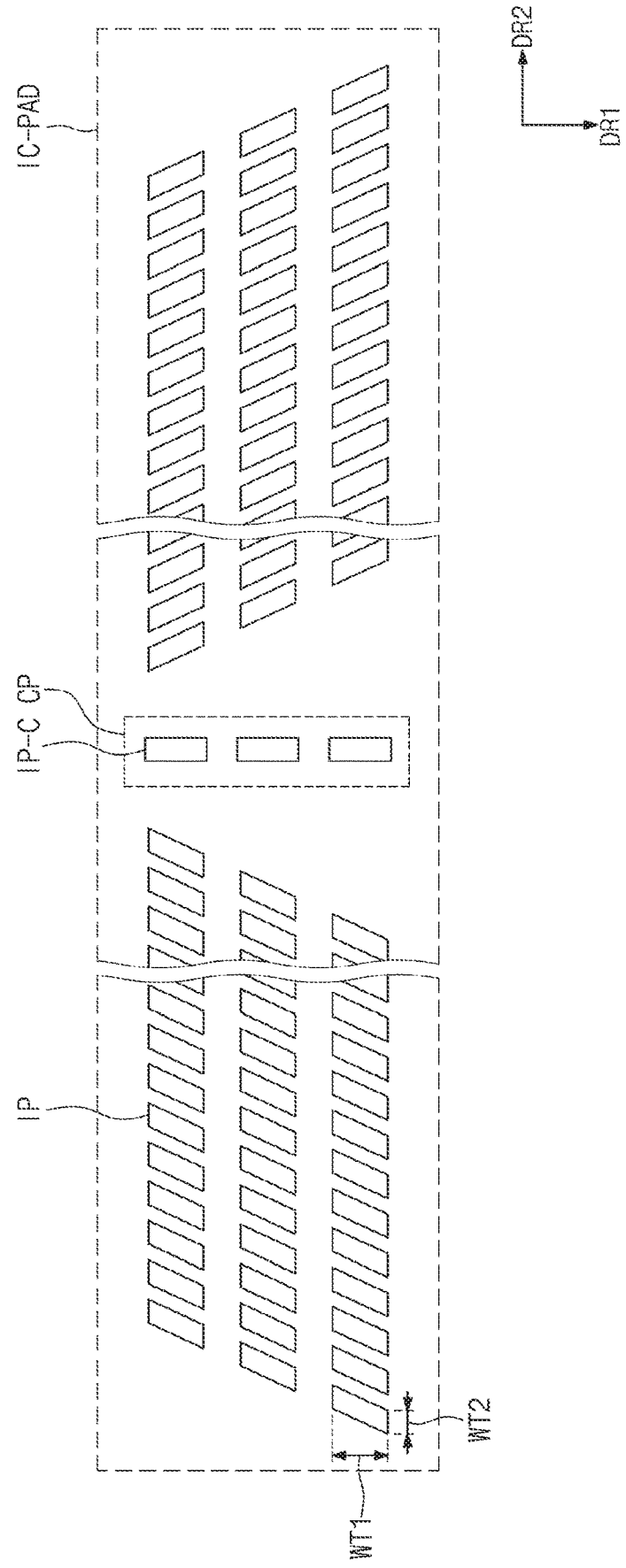

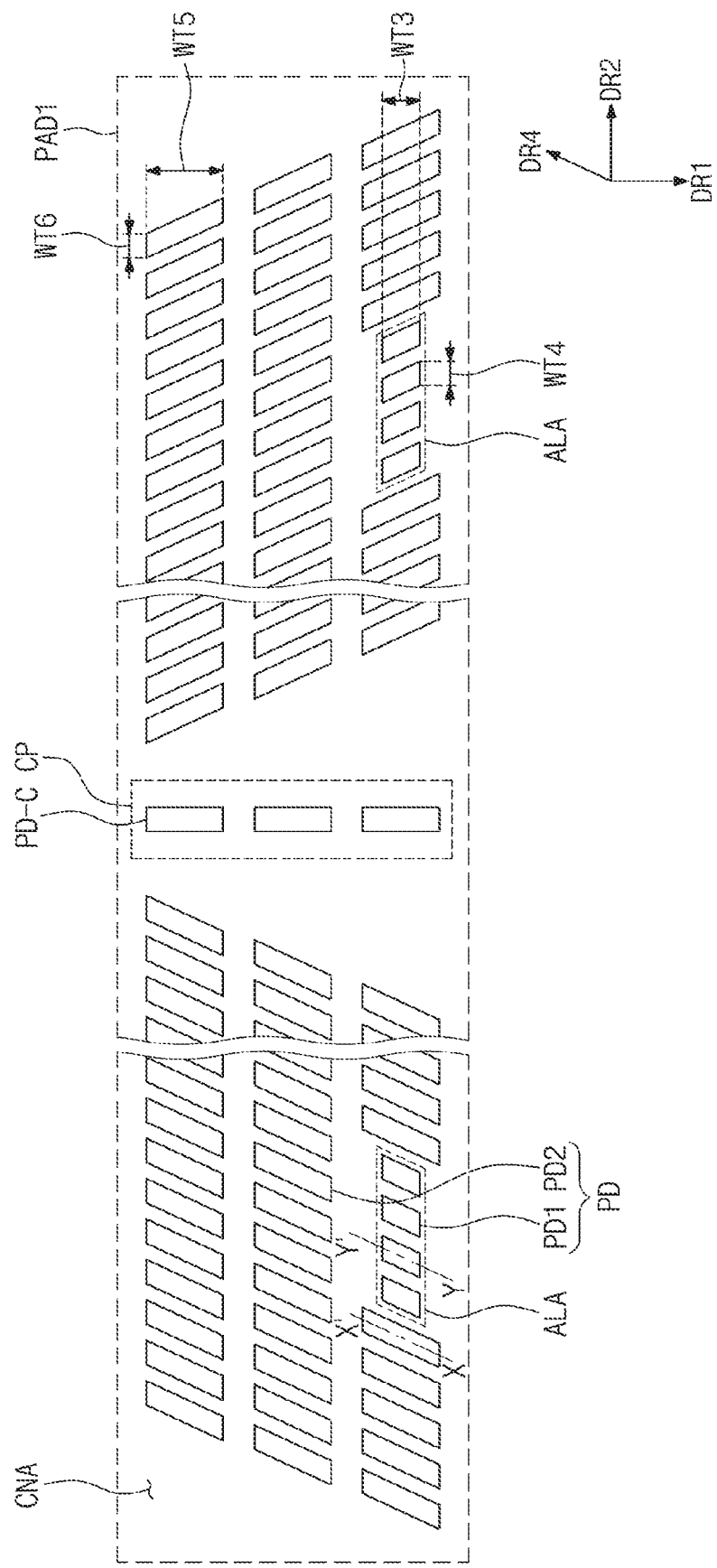

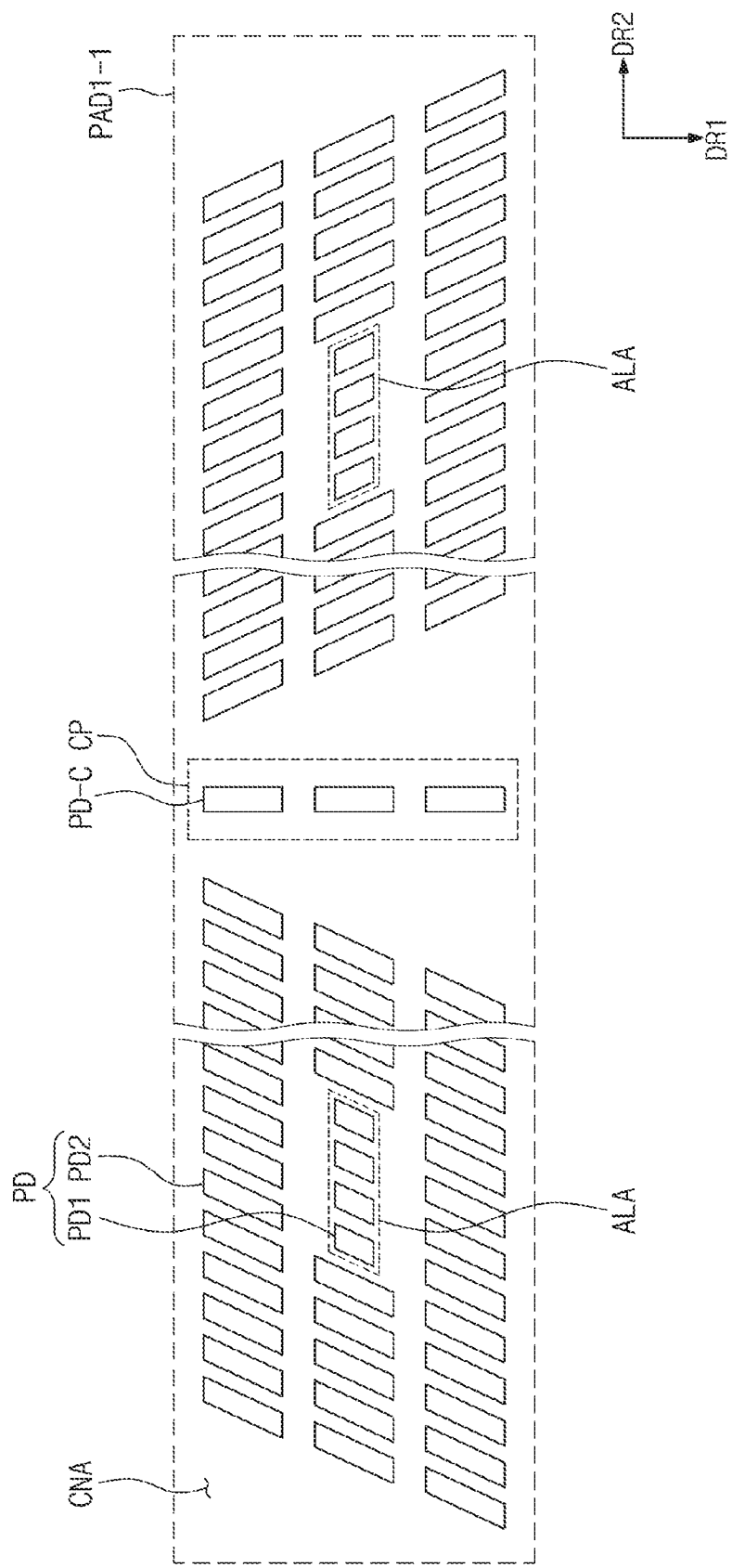

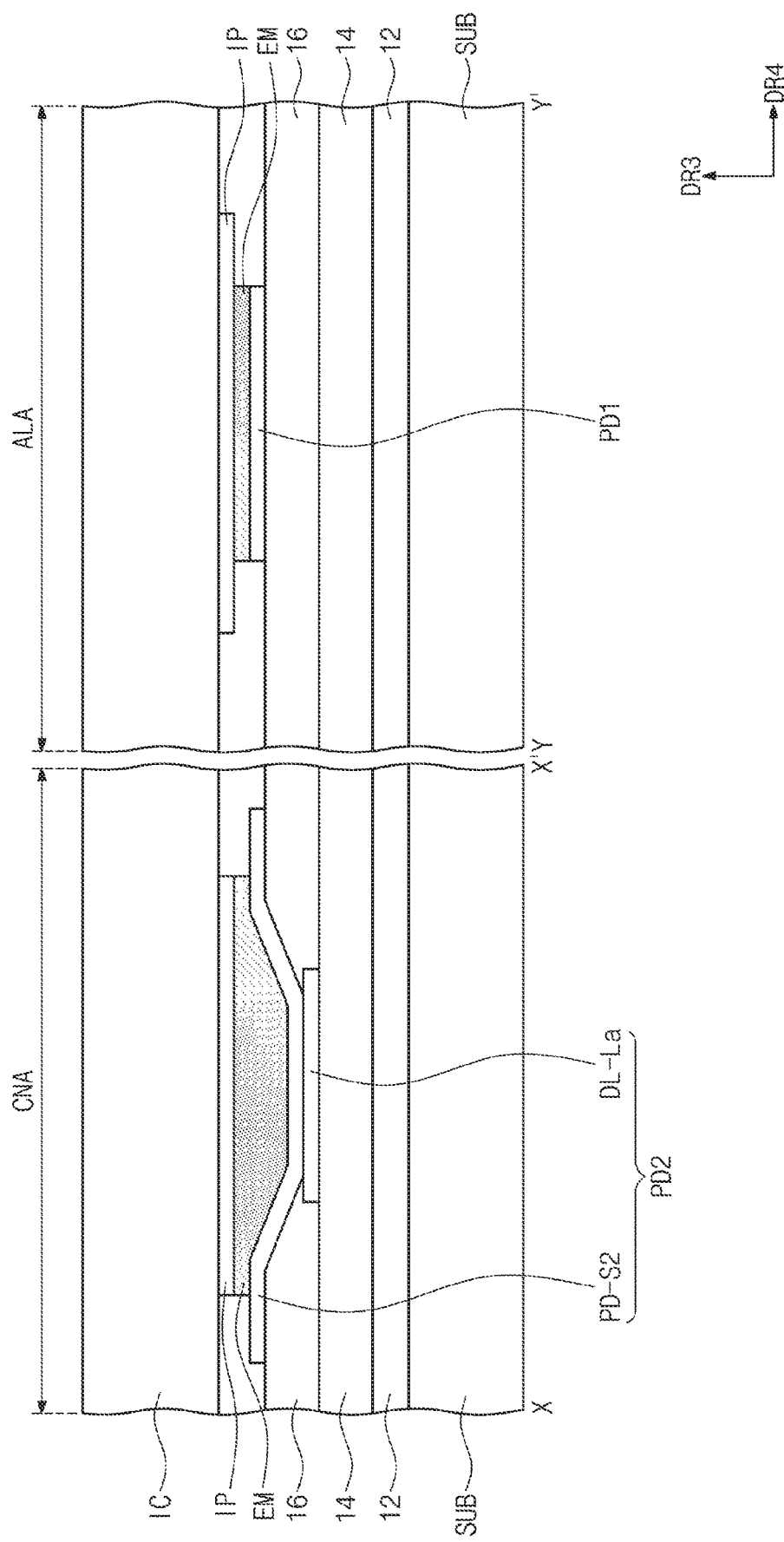

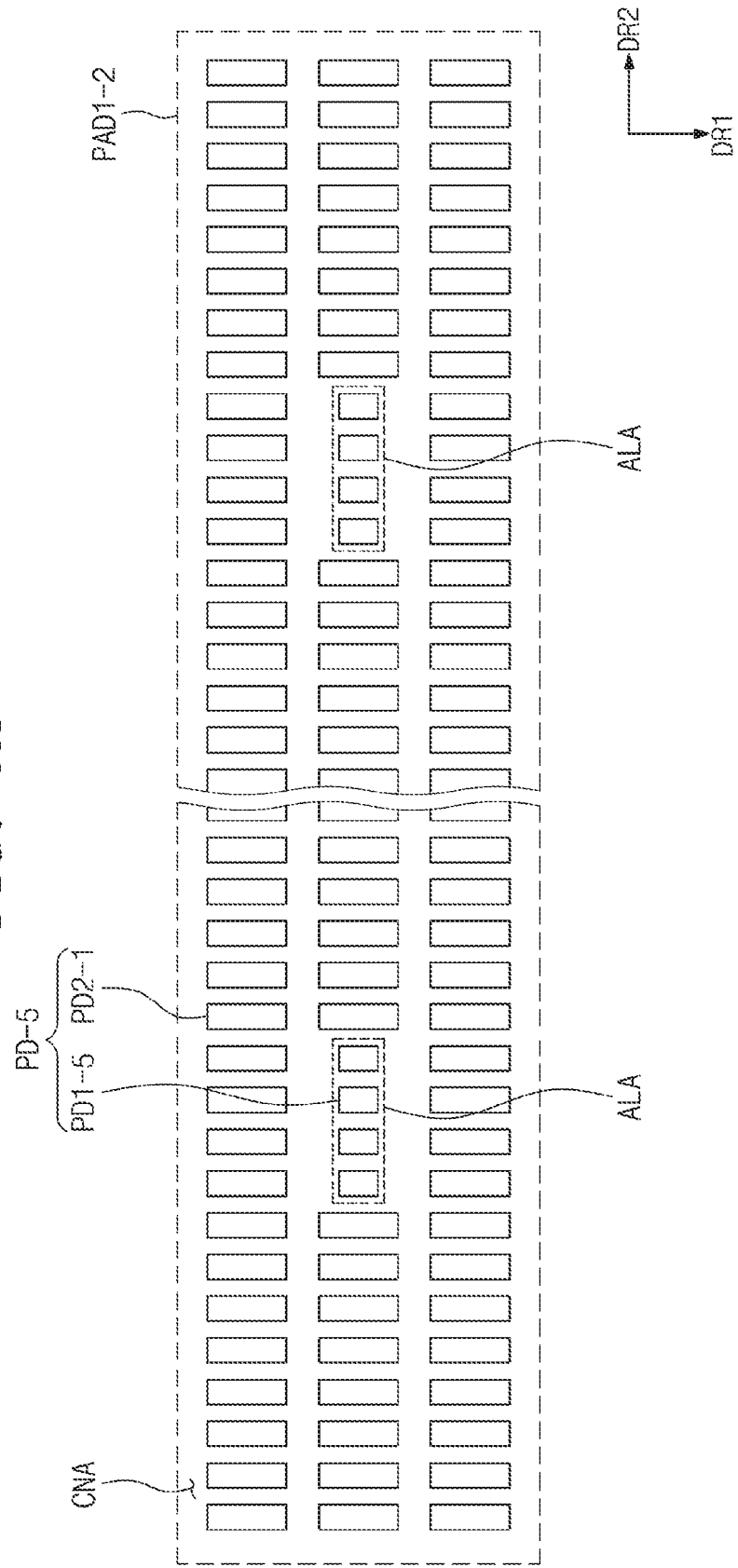

DISPLAY DEVICE

CROSS-REFERENCE TO RELATED APPLICATION

This application is a Continuation of U.S. patent application Ser. No. 15/619,526, filed Jun. 11, 2017, which claims priority from and the benefit of Korean Patent Application No. 10-2016-0098644, filed on Aug. 2, 2016, which is hereby incorporated by reference for all purposes as if fully set forth herein.

BACKGROUND

Field

Exemplary embodiments relate to a display device. More particularly, exemplary embodiments relate to a display device including a pad where a driving chip is mounted.

Discussion of the Background

An electronic device, such as a smartphone, a digital camera, a notebook computer, a navigation system, and a television, each of which provides images, includes a display panel for displaying an image. Generally, thin and light flat panel display panels are widely used for the display panel, and the flat panel display panel includes a liquid crystal display panel, an organic light emitting display panel, a plasma display panel, and an electrophoretic display panel. Recently, foldable display devices folded into a specific shape or bending flexible display devices are under development. Since the foldable and flexible display device is thin and light and does not break, it may be applied not only to IT related products but also to clothes or paper media.

The above information disclosed in this Background section is only for enhancement of understanding of the background of the inventive concept, and, therefore, it may contain information that does not form the prior art that is already known in this country to a person of ordinary skill in the art.

SUMMARY

Exemplary embodiments provide a display device for facilitating the alignment measurement of a pad of a display panel and an element mounted on the pad.

Additional aspects will be set forth in the detailed description which follows, and, in part, will be apparent from the disclosure, or may be learned by practice of the inventive concept.

An exemplary embodiment of the inventive concept discloses a display device including: a display panel including a base layer, a circuit layer disposed on the base layer, and a pad part having a plurality of pads disposed on the base layer; and a driving chip disposed on the pad part and including a plurality of chip pads, wherein the plurality of pads include a first pad having a smaller area than a corresponding chip pad among the plurality of chip pads and a second pad electrically connected to the circuit layer.

The plurality of pads may be arranged in an M×N matrix form.

The first pad may be disposed in an area where a second row to an M−1th row and a second column to an N−1 column overlap.

The second pad may have an area equal to or larger than an area of a corresponding chip pad among the plurality of chip pads.

Each of the plurality of chip pads may have a first width in a first direction and a second width in a second direction intersecting the first direction; and the first pad has a third width in the first direction and a fourth width in the second direction.

The first width may be larger than the third width.

The second width may be larger than the fourth width.

Each of the plurality of pads and the plurality of chip pads may have a parallelogram shape.

Each of the plurality of pads and the plurality of chip pads may have a rectangular shape.

The base layer may be a transparent flexible substrate.

The first pad may be electrically separated from the circuit layer.

The first pad may be electrically connected to the circuit layer.

At least one alignment area may be defined in the pad part and the first pad may be disposed in the alignment area.

Each of the first pad and the second pad may be provided in plural, and the plurality of first pads may be disposed in the alignment area and the plurality of second pads may be disposed in a periphery of the alignment area.

An exemplary embodiment of the inventive concept discloses a display device including: a display panel including a plurality of pads arranged in an M×N matrix form; and a driving chip including a plurality of chip pads electrically coupled with the plurality of pads, wherein the plurality of pads include first pads having a smaller area than a corresponding chip pad among the plurality of chip pads and second pads having an area equal to or larger than an area of a corresponding chip pad among the plurality of chip pads.

The second pads may be disposed in a first row, an Mth row, a first column, and an Nth column, and the first pads and the second pads may be disposed in an area where a second row to an M−1th row and a second column to an N−1th column overlap.

The plurality of chip pads may have a first width in a first direction and a second width in a second direction intersecting the first direction and the first pad may have a third width in the first direction and a fourth width in the second direction, wherein the first width is larger than the third width or the second width is larger than the fourth width.

An exemplary embodiment of the inventive concept discloses a display device including: a base layer; a circuit layer disposed on the base layer; a pad part electrically connected to the circuit layer, disposed on the base layer, and having at least one alignment area and a connection area defined on a flat surface; and a driving chip disposed on the pad part and including a plurality of chip pads electrically connected to the circuit layer through the pad part, wherein the pad part is disposed in the alignment area and includes first pads having a smaller area than a corresponding chip pad among the plurality of chip pads and second pads disposed in the connection area.

The alignment area may be defined as being surrounded by the connection area.

The plurality of chip pads may have larger areas than the first pads and have smaller areas than the second pads.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

FIG. 5A is a plan view of a chip pad part of a driving chip according to an exemplary embodiment of the inventive concept.

FIG. 5B is a plan view of a pad part according to an exemplary embodiment of the inventive concept.

FIG. 5C is a plan view of a pad part according to an exemplary embodiment of the inventive concept.

FIG. 5G is a sectional view illustrating a state in which a pad part and a driving chip are coupled to each other.

FIG. 9A is a plan view of a pad part according to an exemplary embodiment of the inventive concept.

DETAILED DESCRIPTION OF THE ILLUSTRATED EMBODIMENTS

Figure 1:
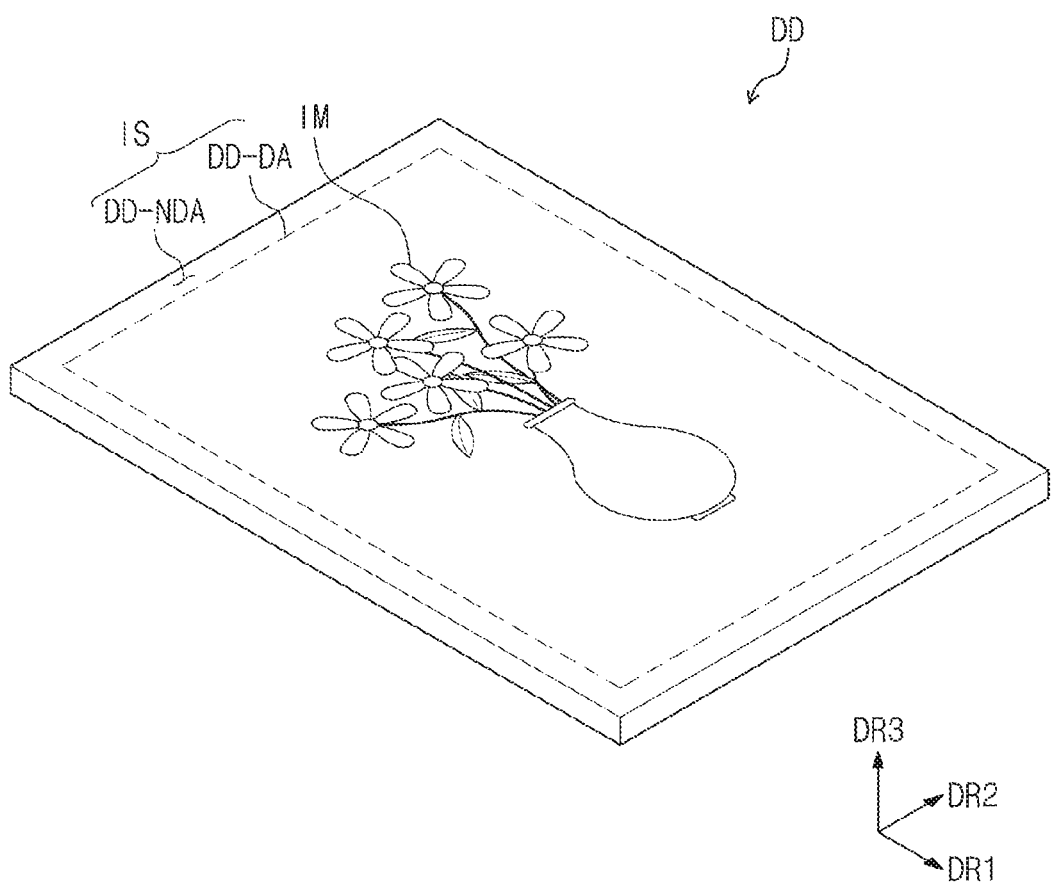
FIG. 1 is a perspective view of a display device according to an exemplary embodiment of the inventive concept.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. The regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein FIG. 1 is a perspective view of a display device according to an exemplary embodiment of the inventive concept.

Referring to FIG. 1, a flat flexible display device is shown as an example of a display device DD. However, the inventive concept may also relate to a foldable display device, a rollable display device, or a bended display device, and is not particularly limited. Additionally, although a flexible display device is shown in an illustrated exemplary embodiment, the inventive concept is not limited thereto. The display device DD according to an illustrated exemplary embodiment may be a flat rigid display device or a bent rigid display device. The display device DD may be used for small and medium-sized electronic devices, such as mobile phones, tablets, car navigations, game consoles, and smart watches, in addition to large-sized electronic devices, such as televisions and monitors.

The display device DD may include a display surface IS where an image IM is displayed, which is parallel to a surface defined by a first direction DR1 and a second direction DR2. The display surface IS of the display device DD may include a plurality of areas. The display device DD may include a display area DD-DA where an image IM is displayed and a non-display area DD-NDA adjacent to the display area DD-DA. The non-display area DD-NDA is an area where no image is displayed.

FIG. 1 illustrates a vase as one example of the image IM. As one example, the display area DD-DA may have a rectangular form. The non-display area DD-NDA may surround the display area DD-DA. However, the inventive concept is not limited thereto, and a form of the display area DD-DA and a form of the non-display area DD-NDA may be designed relatively.

Figure 2:
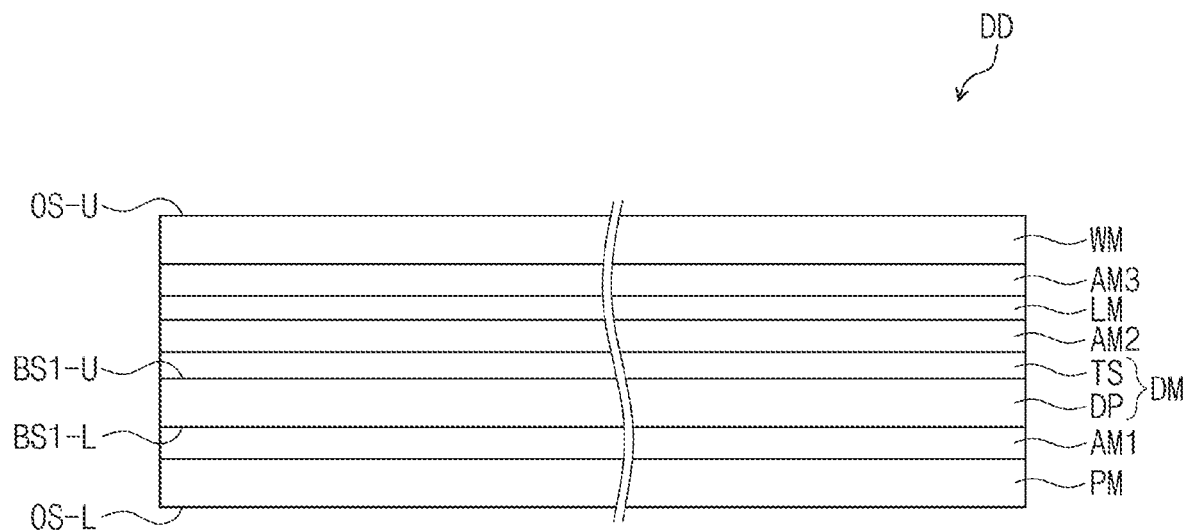
FIG. 2 is a sectional view of a display device according to an exemplary embodiment of the inventive concept.
Figure 2:
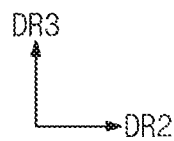

FIG. 2 is a sectional view of a display device DD according to an exemplary embodiment of the inventive concept. FIG. 2 shows a section defined by a second direction DR2 and a third direction DR3.

As shown in FIG. 2, the display device DD includes a protective film PM, a display module DM, an optical member LM, a window WM, a first adhesive member AM1, a second adhesive member AM2, and a third adhesive member AM3. The display module DM is disposed between the protective film PM and the optical member LM. The optical member LM is disposed between the display module DM and the window WM. The first adhesive member AM1 couples the display module DM and the protective film PM, the second adhesive member AM2 couples the display module DM and the optical member LM, and the third adhesive member AM3 couples the optical member LM and the window WM.

The protective film PM protects the display module DM. The protective film PM provides a first outer surface OS-L exposed to the outside and provides an adhesive surface adhering to the first adhesive member AM1. The protective film PM prevents external moisture from penetrating the display module DM and absorbs external impact.

The protective film PM may include a plastic film as a base substrate. The protective film PM may include a plastic film including one selected from the group consisting of polyethersulfone (PES), polyacrylate, polyetherimide (PEI), polyethylenenaphthalate (PEN), polyethyleneterephthalate (PET), polyphenylene sulfide (PPS), polyarylate, polyimide (PI), polycarbonate (PC), poly(arylene ethersulfone), and a combination thereto.

A material constituting the protective film PM is not limited to plastic resins and may include an organic/inorganic composite material. The protective film PM may include an inorganic material filled in the pores of a porous organic layer and an organic layer. The protective film PM may further include a functional layer formed at a plastic film. The functional layer may include a resin layer. The functional layer may be formed through a coating method. According to an exemplary embodiment of the inventive concept, the protective film PM may be omitted.

The window WM may protect the display module DM from an external impact and provide an input surface to a user. The window WM provides a second outer surface OS-U exposed to the outside and provides an adhesive surface adhering to the second adhesive member AM2. The display surface IS shown in FIG. 1 may be the second outer surface OS-U.

The window WM may include a plastic film. The window WM may have a multilayer structure. The window WM may have a multilayer structure selected from a glass substrate, a plastic film, or a plastic substrate. The window WM may further include a bezel pattern. The multilayer structure may be formed through a continuous process or an adhering process using an adhesive layer.

The optical member LM reduces an external light reflectance. The optical member LM may include at least a polarizing film. The optical member LM may further include a phase difference film. According to an exemplary embodiment of the inventive concept, the optical member LM may be omitted.

The display module DM may include a display panel DP and a touch detection unit TS. The touch detection unit TS may be directly disposed on the display panel DP. In this specification, "directly disposed" means "being formed" through a continuous process, excluding "attached" through an additional adhesive layer. However, this is exemplary, and the touch detection unit TS may be disposed on the thin film sealing layer TFE after being formed on a film or a substrate.

The display panel DP generates the image 1M (see FIG. 1) corresponding to inputted image data. The display panel DP provides a first display panel surface BS1-L and a second display panel surface BS1-U facing it in a thickness direction DR3. In an exemplary embodiment, although the display panel DP is exemplarily described, the display panel is not limited thereto.

The touch detection unit TS obtains coordinate information of an external input. The touch detection unit TS may detect an external input through a capacitance method.

Although not shown separately, the display module DM according to an exemplary embodiment of the inventive concept may further include an anti-reflective layer. The anti-reflective layer may include a color filter or a layer-stacked structure of conductive layer/insulation layer/conductive layer. The anti-reflective layer may reduce an external light reflectance by absorbing, destructive-interfering, or polarizing the light incident from the outside. The anti-reflective layer may replace a function of the optical member LM.

Each of the first adhesive member AM1, the second adhesive member AM2, and the third adhesive member AM3 may be an organic adhesive layer, such as an Optically Clear Adhesive (OCA) film, Optically Clear Resin (OCR), or a Pressure Sensitive Adhesive (PSA) film. The organic adhesive layer may include an adhesive material such as a polyurethane, polyacrylic, polyester, polyepoxy, and polyvinyl acetate.

Figure 3:
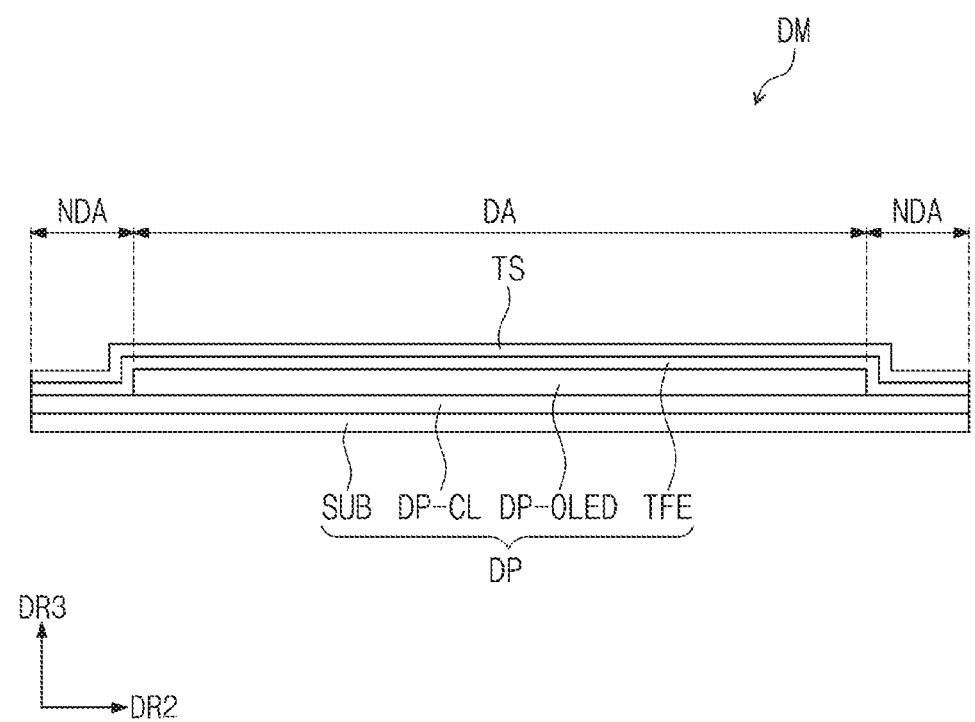
FIG. 3 is a sectional view of a display module according to an exemplary embodiment of the inventive concept.

FIG. 3 is a sectional view of a display module DM according to an exemplary embodiment of the inventive concept.

Referring to FIG. 3, the display module DM may include a display panel DP and a touch detection unit TS. FIG. 3 illustrates an organic light emitting display panel as one example of the display panel DP. However, the inventive concept is not limited thereto, and the display panel DP may be a liquid crystal display panel, a plasma display panel, and an electrophoretic display panel.

The display panel DP includes a base layer SUB, a circuit layer DP-CL disposed on the base layer SUB, a light emitting device layer DP-OLED, and a thin film sealing layer TFE.

The base layer SUB may include at least one plastic film. The base layer SUB may include a plastic substrate, a glass substrate, a metal substrate, or an organic/inorganic composite material substrate as a transparent flexible substrate. The plastic substrate may include at least one of acrylic resin, methacrylic resin, polyisoprene, vinyl resin, epoxy resin, urethane resin, cellulose resin, siloxane-based resin, polyimide-based resin, polyamide-based resin, and perylene resin. The term "transparent" means that it has a light transmittance of more than 0% and includes translucency.

The circuit layer DP-CL may include a plurality of insulation layers, a plurality of conductive layers, and a semiconductor layer. The plurality of conductive layers of the circuit layer DP-CL may constitute signal lines or a control circuit of a pixel.

The light emitting device layer DP-OLED includes organic light emitting diodes.

The thin film sealing layer TFE seals the light emitting device layer DP-OLED. The thin film sealing layer TFE includes a plurality of inorganic thin films and at least one organic thin film therebetween. The inorganic thin films protect the light emitting device layer DP-OLED from moisture/oxygen and the organic thin film protects the light emitting device layer DP-OLED from a foreign material such as dust particles.

The touch detection unit TS includes touch sensors and touch signal lines. The touch sensors and the touch signal lines may have a single or multilayer structure. The touch sensors and the touch signal lines may include indium tin oxide (ITO), indium zinc oxide (IZO), zinc oxide (ZnO), indium tin zinc oxide (ITZO), PEDOT, metal nano wire, and graphene. The touch sensors and the touch signal lines may include a metal layer, for example, molybdenum, silver, titanium, copper, aluminum, or an alloy thereof. The touch sensors and the touch signal lines may have the same or different layer structure.

Figure 4A:
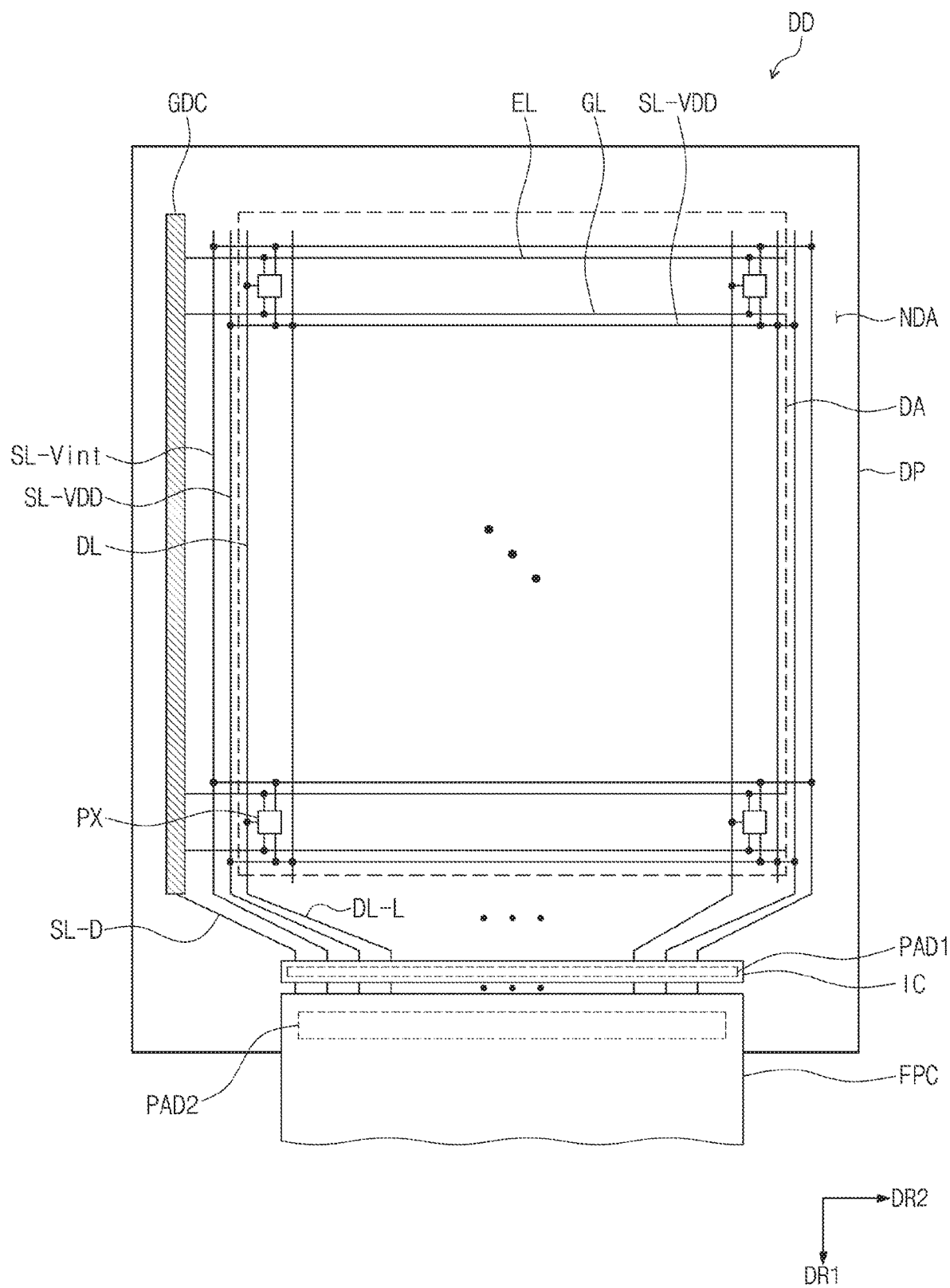
FIG. 4A is a plan view of a display device according to an exemplary embodiment of the inventive concept.

FIG. 4A is a plan view of a display device DD according to an exemplary embodiment of the inventive concept.

Referring to FIG. 4A, the display device DD may include a display panel DP, a driving chip IC, and a printed circuit board FPC.

The display panel DP includes a display area DA and a non-display area NDA on a plane. The display area DA and the non-display area NDA of the display panel DP correspond to the display area DD-DA (see FIG. 1) and the non-display area DD-NDA (see FIG. 1) of the display device DD, respectively. The display area DA and the non-display area NDA of the display panel DP may not be necessarily identical to the display area DD-DA (see FIG. 1) and the non-display area DD-NDA (see FIG. 1) of the display area DD, and may vary according to a structure/design of the display panel DP.

The display panel DP includes a plurality of pixels PX. An area where the pixels PX are disposed may be defined as the display area DA. In an exemplary embodiment, the non-display area NDA may be defined along the outline of the display area DA.

The display panel DP includes gate lines GL, data lines DL, light emitting lines EL, a control signal line SL-D, an initialization voltage line SL-Vint, a voltage line SL-VDD, a first pad part PAD1, and a second pad part PAD2.

The gate lines GL are respectively connected to corresponding pixels PX among the plurality of pixels PX, and the data lines DL are respectively connected to corresponding pixels PX among the plurality of pixels PX. Each of the light emitting lines EL may be arranged parallel to a corresponding gate line among the gate lines GL. The control signal line SL-D may provide control signals to the gate driving circuit GDC. The initialization voltage line SL-Vint may provide an initialization voltage to the plurality of pixels PX. The voltage line SL-VDD may be connected to the plurality of pixels PX and provide a first voltage to them. The voltage line SL-VDD may include a plurality of lines extending in the first direction DR1 and a plurality of lines extending in the second direction DR2.

The gate driving circuit GDC where the gate lines GL and the light emitting lines EL are connected may be disposed at one side of the non-display area NDA. Some of the gate lines GL, the data lines DL, the light emitting lines EL, the control signal line SL-D, the initialization voltage line SL-Vint, and the voltage line SL-VDD are disposed at the same layer and some of them are disposed at different layers.

The first pad part PAD1 may extend from the end of the data lines DL to be connected to a data wiring part DL-L disposed in the non-display area NDA. The second pad part PAD2 may be connected to the ends of the control signal line SL-D, the initialization voltage line SL-Vint, and the voltage line SL-VDD.

The driving chip IC may be electrically coupled to the first pad part PAD1. The driving chip IC may provide a driving signal and data as electrical signals to the pixels PX of the display area DA. The driving chip IC and the first pad part PAD1 may be electrically connected to each other through an Anisotropic Conductive Film (ACF). However, the inventive concept is not limited thereto, and the driving chip IC and the first pad part PAD1 may be bonded through a solder bump. The driving chip IC may be mounted on the display panel DP through a Chip On Plastic (COP) method or a Chip In Glass (COG) method.

The printed circuit board FPC may be electrically coupled to the second pad part PAD2. The printed circuit board FPC may have a flexible property. After being coupled to the display panel DP, the printed circuit board FPC may be bent to the back surface of the display panel DP. The printed circuit board FPC may deliver a control signal for controlling the drive of the display panel DP. The printed circuit board FPC and the second pad part PAD2 may be electrically connected to each other through an ACF.

The circuit layer DP-CL (see FIG. 3) may include a display circuit layer disposed in the display area DA and non-display circuit layers disposed in the non-display area NDA. The display circuit layers may include the gate lines GL disposed in the display area DA, the data lines DL, the light emitting lines EL, the initialization voltage line SL-Vint, and circuits in the pixels PX. The non-display circuit layer may include a gate driving circuit, a control signal line SL-D, wires connecting the display circuit layer and the first pad part PAD1, and wires connecting the first pad part PAD1 and the second pad part PAD2.

Figure 4B:
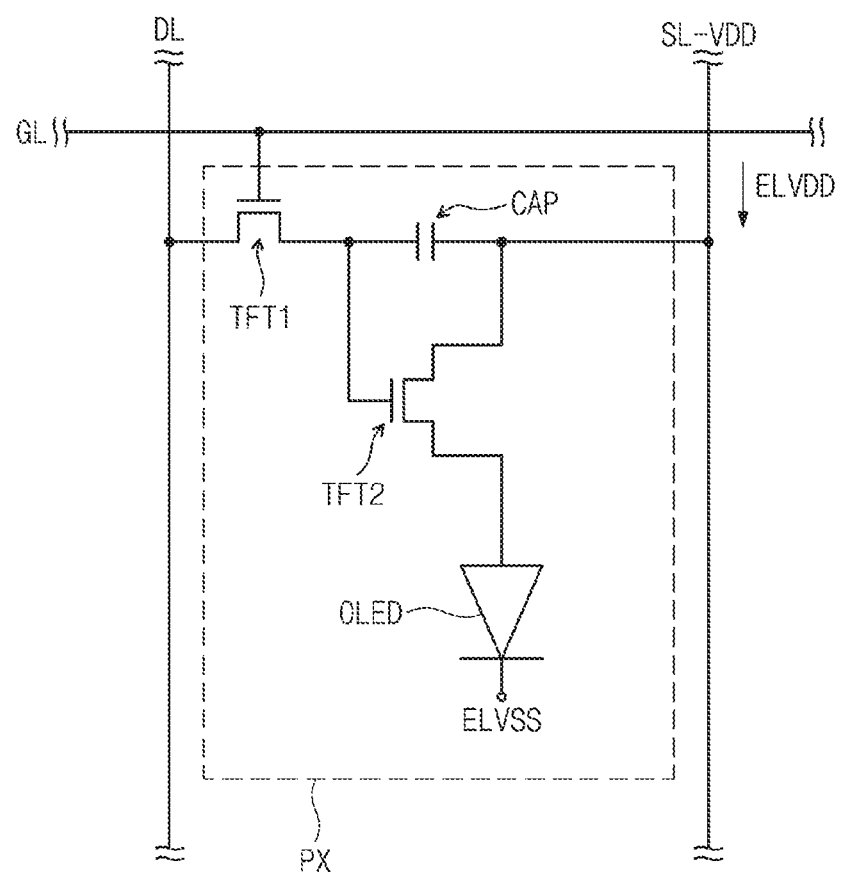
FIG. 4B is an equivalent circuit diagram of a pixel according to an exemplary embodiment of the inventive concept.

FIG. 4B is an equivalent circuit diagram of a pixel PX according to an exemplary embodiment of the inventive concept.

FIG. 4B exemplarily shows a pixel PX connected to a gate line GL, a data line DL, and a voltage line SL-VDD. A configuration of the pixel PX is not limited thereto and may be modified and implemented.

The pixel PX includes an organic light emitting diode OLED as a display element. The organic light emitting diode OLED may be a front-light-emitting-type diode or a rear-light-emitting-type diode. The pixel PX includes a first transistor TFT1 (or a switching transistor), a second transistor TFT2 (or a driving transistor), and a capacitor CAP, as a driving circuit for driving the organic light emitting diode OLED.

The first transistor TFT1 outputs a data signal applied to the data line DL in response to a scan signal applied to the gate line GL. The capacitor CAP charges a voltage corresponding to a data signal received from the first transistor TFT1.

The second transistor TFT2 is connected to the organic light emitting diode OLED. The second transistor TFT2 controls a driving current flowing through the organic light emitting diode OLED in correspondence to a charge amount stored in the capacitor CAP. The organic light emitting device OLED may emit light during a turn-on section of the second transistor TFT2.

Figure 4C:
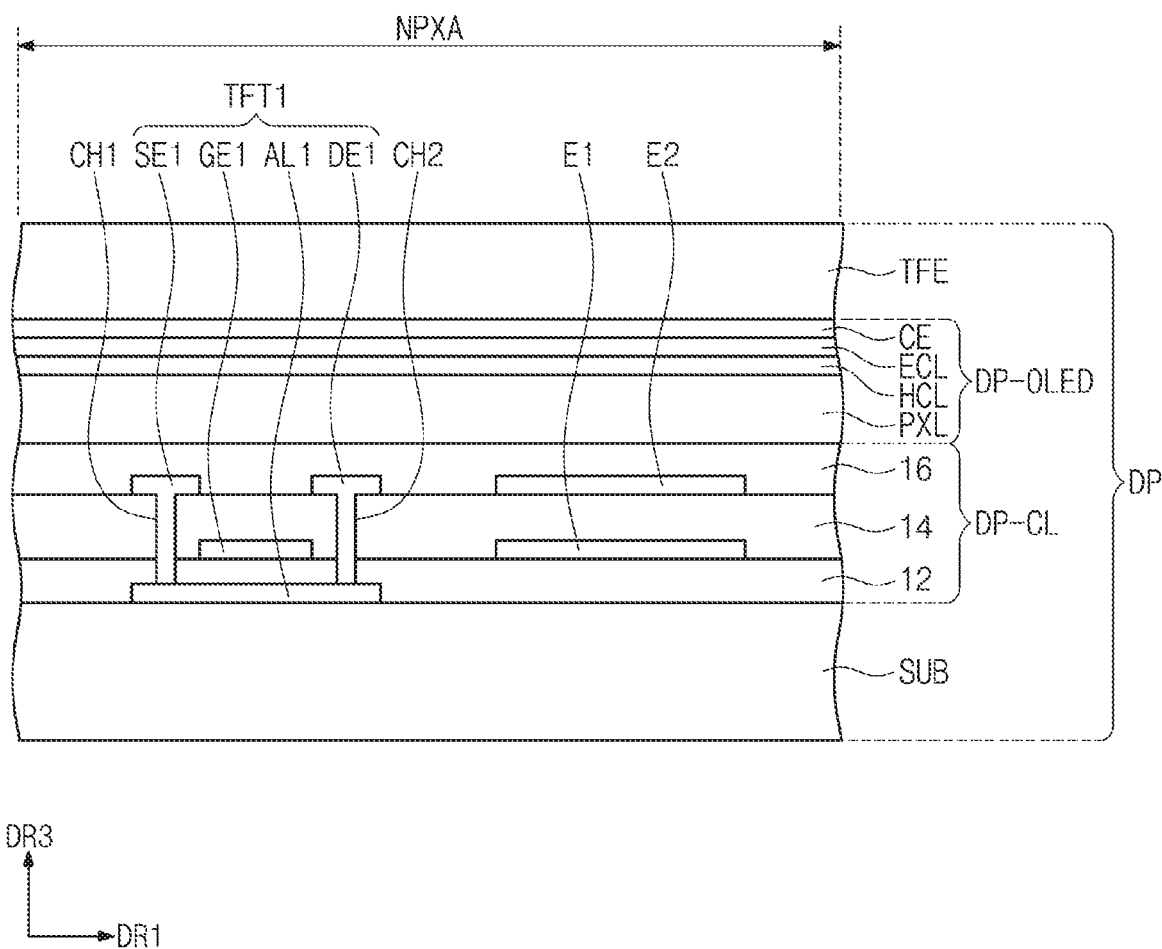
FIGS. 4C and 4D are partial sectional views of a display panel according to an embodiment of the inventive concept.
Figure 4D:
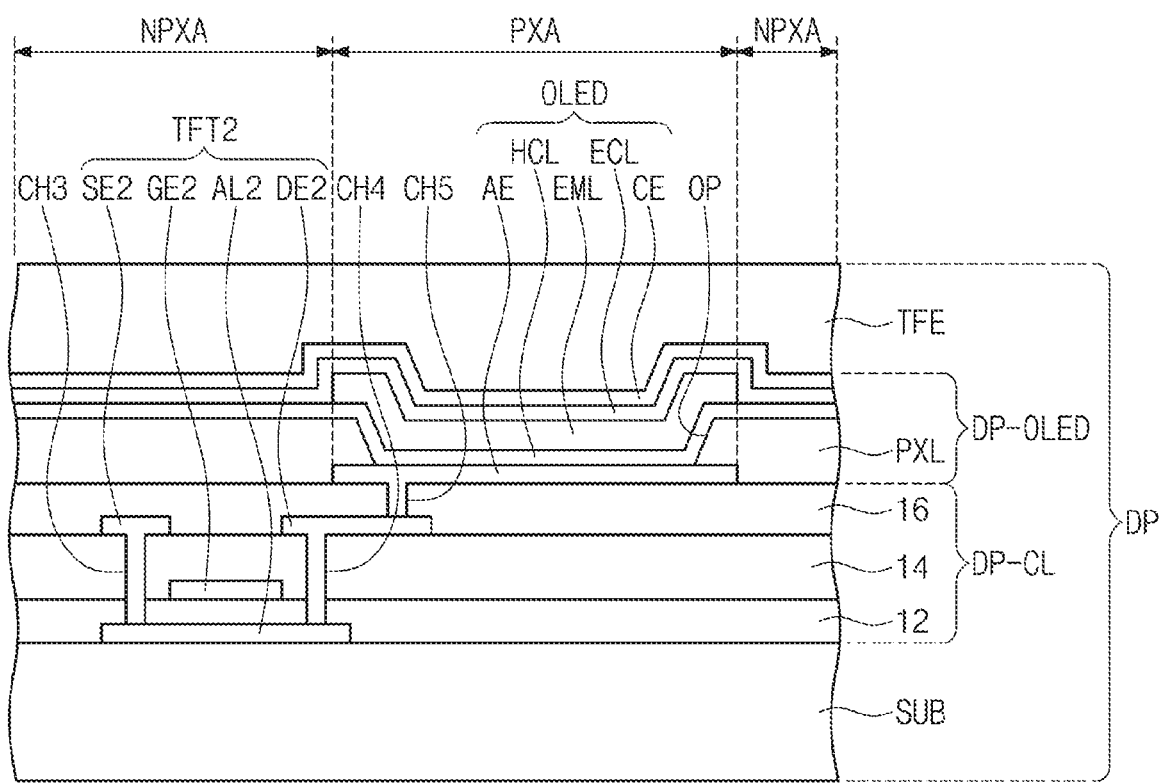

FIGS. 4C and 4D are partial sectional views of a display panel DP according to an exemplary embodiment of the inventive concept.

FIG. 4C illustrates a section of a portion corresponding to the first transistor TFT1 and the capacitor CAP of the equivalent circuit shown in FIG. 4B. FIG. 4D illustrates a section of a portion corresponding to the second transistor TFT2 and the organic light emitting diode OLED of the equivalent circuit shown in FIG. 4B.

As shown in FIGS. 4C and 4D, a circuit layer DP-CL is disposed on a base layer SUB. A semiconductor pattern AL1 (hereinafter referred to as a first semiconductor pattern) of the first transistor TFT1 and a semiconductor pattern AL2 (hereinafter referred to a second semiconductor pattern) of the second transistor TFT2 are disposed on the base layer SUB. The first semiconductor pattern AL1 and the second semiconductor pattern AL2 may be identically or differently selected from amorphous silicon, polysilicon, and a metal oxide semiconductor.

Although not shown separately, function layers may be further disposed on one surface of the base layer SUB. The function layers include at least one of a barrier layer or a buffer layer. The first semiconductor pattern AL1 and the second semiconductor pattern AL2 may be disposed on a barrier layer or a buffer layer.

A first insulation layer 12 for covering the first semiconductor pattern AL1 and the second semiconductor pattern AL2 is disposed on the base layer SUB. The first insulation layer 12 may include an organic layer and/or an inorganic layer. Especially, the first insulation layer 12 may include a plurality of inorganic thin films. The plurality of inorganic thin films may include a silicon nitride layer and a silicon oxide layer.

A control electrode GE1 (hereinafter referred to as a first control electrode) of the first transistor TFT1 and a control electrode GE2 (hereinafter referred to as a second control electrode) of the second transistor TFT2 are disposed on the first insulation layer 12. A first electrode E1 of a capacitor CAP is disposed on the first insulation layer 12. The first control electrode GE1, the second control electrode GE2, and the first electrode E1 may be fabricated according to the same photolithography process as the gate lines GL (see FIG. 4A). That is, the first electrode E1 may be formed of the same material, may have the same layer-stacked structure, and may be disposed on the same layer as the gate lines GL.

A second insulation layer 14 for covering the first control electrode GE1, the second control electrode GE2, and the first electrode E1 is disposed on the first insulation layer 12. The second insulation layer 14 may include an organic layer and/or an inorganic layer. Especially, the second insulation layer 14 may include a plurality of inorganic thin films. The plurality of inorganic thin films may include a silicon nitride layer and a silicon oxide layer.

The data lines DL (see FIG. 4A) may be disposed on the second insulation layer 14. An input electrode SE1 (hereafter referred to as a first input electrode) and an output electrode DE1 (hereinafter referred to as a first output electrode) of the first transistor TFT1 are disposed on the second insulation layer 14. An input electrode SE2 (hereafter referred to as a second input electrode) and an output electrode DE2 (hereinafter referred to as a second output electrode) of the second transistor TFT2 are disposed on the second insulation layer 14. The first input electrode SE1 may branch from a corresponding data line among the data lines DL. The power line PL (see FIG. 4A) may be disposed on the same layer as the data lines DL. The second input electrode SE2 may branch from the power line PL.

A second electrode E2 of a capacitor CAP is disposed on the second insulation layer 14. The second electrode E2 may be manufactured according to the same photolithography process, may be formed of the same material, may have the same layer-stacked structure, and may be disposed on the same layer as the data lines DL and the power line PL.

Each of the first input electrode SE1 and the first output electrode DE1 is connected to the first semiconductor pattern AL1 through a first through hole CH1 and a second through hole CH2 penetrating the first insulation layer 12 and the second insulation layer 14. The first output electrode DE1 may be electrically connected to the first electrode E1. For example, the first output electrode DE1 may be connected to the first electrode E1 via a through hole (not shown) penetrating the second insulation layer 14. Each of the second input electrode SE2 and the second output electrode DE2 is connected to the second semiconductor pattern AL2 through a third penetration hole CH3 and a fourth penetration hole CH4 penetrating the first insulation layer 12 and the second insulation layer 14. On the other hand, according to another exemplary embodiment of the inventive concept, the first transistor TFT1 and the second transistor TFT may be modified as a bottom gate structure and implemented as such.

A third insulation layer 16 for covering the first input electrode SE1, the first output electrode DE1, the second input electrode SE2, and the second output electrode DE2 is disposed on the third insulation layer 14. The third insulation layer 16 may include an organic layer and/or an inorganic layer. Especially, the third insulation layer 16 may include an organic material for providing a flat surface.

One of the first insulation layer 12, the second insulation layer 14, and the third insulation layer 16 may be omitted according to a circuit structure of a pixel. Each of the second insulation layer 14 and the third insulation layer 16 may be defined as an interlayer insulation layer. The interlayer insulation layer is disposed between a conductive pattern disposed at a lower part and a conductive pattern disposed at an upper part on the basis of the interlayer insulation layer to insulate the conductive patterns.

The circuit layer DP-CL includes dummy conductive patterns. The dummy conductive patterns are disposed in the same layer as the semiconductor patterns AL1 and AL2, the control electrodes GE1 and GE2, or the output electrodes DE1 and DE2. The dummy conductive patterns may be disposed in the non-display area NDA (see FIG. 4A). The dummy conductive patterns will be described in detail later.

A light emitting element layer DP-OLED is disposed on the third insulation layer 16. A pixel definition layer PXL and an organic light emitting diode OLED are disposed on the third insulation layer 16. An anode AE is disposed on the third insulation layer 16. The anode AE is connected to the second output electrode DE2 via a fifth through hole CH5 penetrating the third insulation layer 16. An opening part OP is defined in the pixel definition layer PXL. The opening part OP of the pixel definition layer PXL exposes at least a part of the anode AE.

The light emitting element layer DP-OLED includes a light emitting area PXA and a non-light emitting area NPXA adjacent to the light emitting area PXA. The non-light emitting area NPXA may surround the light emitting area PXA. According to this exemplary embodiment, the light emitting area PXA is defined corresponding to the anode AE. However, the light emitting area PXA is not limited thereto, and it is sufficient if the light emitting region PXA is defined as an area where light is generated. The light emitting area PXA may be defined to correspond to a partial area of the anode AE exposed by the opening part OP.

A hole control layer HCL may be commonly disposed in the light emitting area PXA and the non-light emitting area NPXA. Although not shown in the drawing separately, a common layer, such as the hole control layer HCL, may be commonly formed in the plurality of pixels PX (see FIG. 4A).

An organic light emitting layer EML is disposed on the hole control layer HCL. The organic light emitting layer EML may be disposed in only an area corresponding to the opening part OP. That is, the organic light emitting layer EML may be divided and formed at each of the plurality of pixels PX.

An electronic control layer ECL is disposed on the organic light emitting layer EML. A cathode CE is disposed on the electronic control layer ECL. The cathode CE is commonly disposed at the plurality of pixels PX.

Although the patterned organic light emitting layer EML is shown according to this exemplary embodiment, the organic light emitting layer EML may be commonly disposed in the plurality of pixels PX. At this point, the organic light emitting layer EML may generate white light. Additionally, the organic light emitting layer EML may have a multilayer structure.

According to this exemplary embodiment, the thin film sealing layer TFE directly covers the cathode CE. According to an exemplary embodiment of the inventive concept, a capping layer for covering the cathode CE may be further disposed. At this point, the thin film sealing layer TFE directly covers the capping layer.

FIG. 5A is a plan view of a chip pad part IC-PAD of the driving chip IC (see FIG. 4A) according to an exemplary embodiment of the inventive concept. FIG. 5B is a plan view of a first pad part PAD1 according to an exemplary embodiment of the inventive concept.

Referring to FIG. 5A, the chip pad part IC-PAD may be provided on a surface where the driving chip IC (see FIG. 4A) contacts the first pad part PAD1. The chip pad part IC-PAD may be electrically connected to circuits inside the driving chip IC (see FIG. 4A).

The chip pad part IC-PAD may include a plurality of chip pads IP, and the first pad part PAD1 may include a plurality of pads PD. Each of the plurality of chip pads IP and each of the plurality of pads PD may face each other in a one-to-one correspondence. Therefore, the plurality of chip pads IP and the plurality of pads PD may have the same arrangement.

The plurality of chip pads IP may be arranged in an M×N matrix form. That is, M (M is an integer of 1 or more) chip pads may be arranged along the first direction DR1, and N (N is an integer of 1 or more) chip pads may be arranged along the second direction DR2.

The chip pads IP-C arranged in the middle area CP overlapping the center of the width of the second direction DR2 among the plurality of chip pads IP may have a rectangular shape. Although FIG. 5A shows that only the chip pads IP-C of one column (hereinafter, the column is referred to as being parallel to the first direction DR1 in the detailed description) have a rectangular shape, the inventive concept is not limited thereto. For example, the chip pads IP-C in a plurality of columns may have a rectangular shape in the middle area CP. The remaining chip pads IP, other than the chip pads IP-C disposed in the middle area CP, may have a parallelogram shape.

The chip pads IP arranged facing each other with the chip pads IP-C therebetween may have a shape symmetrical to each other. In FIG. 5A, the chip pads IP may have a parallelogram shape.

Each of the chip pads IP may have a first area. Each of the chip pads IP may have a first width WT1 in the first direction DR1 and a second width WT2 in the second direction DR2. The first area may be a product of the first width WT1 and the second width WT2.

Referring to FIG. 5B, the plurality of pads PD may be arranged in an M×N matrix form. That is, M (M is an integer of 1 or more) pads may be arranged along the first direction DR1, and N (N is an integer of 1 or more) pads may be arranged along the second direction DR2. In FIG. 5B, M is 3. Although it is shown in FIGS. 5A and 5B as one example that the number of the plurality of chip pads IP is equal to the number of the plurality of pads PD, the inventive concept is not limited thereto. The number of the plurality of chip pads IP and the number of the plurality of pads PD may be different.

The pads IP-C arranged in the middle area CP overlapping the center of the width of the second direction DR2 among the plurality of pads IP may have a rectangular shape. Although FIG. 5B exemplarily shows that only the pads PD-C in one column have a rectangular shape, the inventive concept is not limited thereto. For example, the pads PD-C in a plurality of columns may have a rectangular shape in the middle area CP. The remaining pads PD, other than the pads PD disposed in the middle area CP, may have a parallelogram shape.

When the base layer SUB (see FIG. 3) includes a plastic film, the base layer SUB may expand or contract by predetermined processes. When the base layer SUB (see FIG. 3) expands, an interval between the pads PD is increased. In the case that the pads PD have a parallelogram shape, when the driving chip IC is raised higher than the center of the pads PD and attached, even if an interval between the pads PD is increased, the chip pads IP of the driving chip IC may be attached to the pads PD in a one-to-one correspondence. Further, when the base layer SUB (see FIG. 3) contracts, an interval between the pads PD is reduced. Whenever the pads PD have a parallelogram shape, when the driving chip IC is lowered than the center of the pads PD and attached, even if an interval between the pads PD is reduced, the chip pads IP of the driving chip IC may be attached to the pads PD in a one-to-one correspondence.

The plurality of pads PD may include a first pad PD1 and a second pad PD2. The first pad PD1 may have a second area smaller than a first area of the second pad PDF2. The second pad PD2 may have a third area larger than the second area. The third area may be larger than the first area. That is, the second area of the first pad PD1<the first area of the chip pad IP<the third area of the second pad PD2. It is sufficient that the third area of the second pad PD2 is only larger than the second area, and the third area may be variously modified. For example, the third area of the second pad PD2 may be equal to or smaller than the first area of the chip pad IP.

The first pad PD1 may have a third width WT3 in the first direction DR1 and a fourth width WT4 in the second direction DR2. The second pad PD2 may have a fifth width WT5 in the first direction DR1 and a sixth width WT6 in the second direction DR2. The second area may be a product of the third width WT3 and the fourth width WT4. The third area may be a product of the fifth width WT5 and the sixth width WT6.

An area where the first pad PD1 of the first pad part PAD1 is disposed is defined as an alignment area ALA and an area where the second pad PD2 is disposed is defined as a connection area CNA. Although FIG. 5B exemplarily shows that four first pads PD1 are disposed in one alignment area ALA, the inventive concept is not limited thereto. The number of the first pads PD1 disposed in one alignment area ALA may be one or more. In addition, FIG. 5B exemplarily shows that two alignment areas ALA are defined in the first pad part PAD1. However, the inventive concept is not limited thereto. For example, the number of the alignment areas ALA may be two or more, or may be one, depending on the size of the display panel DP (see FIG. 4).

The alignment area ALA may be disposed in the Mth row. Specifically, the alignment area ALA in FIG. 5A may be arranged in the third row. The alignment area ALA may be disposed at the outermost of the plurality of pads PD. The first pad PD1 disposed in the alignment area ALA may be electrically separated from the circuit layer DP-CL (see FIG. 3). That is, the first pad PD1 may be a floating pattern. The first pad PD1 may be used only for alignment confirmation and not to deliver a predetermined signal. However, the inventive concept is not limited thereto, and the first pad PD1 may be electrically connected to the circuit layer DP-CL (see FIG. 3C).

FIG. 5C is a plan view of a first pad part PAD1-1 according to an exemplary embodiment of the inventive concept.

When the first pad portion PAD1-1 of FIG. 5C is compared to the first pad part PAD1 of FIG. 5B, there is a difference in the position of the alignment area ALA. This will be described below in more detail.

The first pad part PAD1-1 may include a plurality of pads PD. The plurality of pads PD may be arranged in an M×N matrix form. That is, M pads may be arranged along the first direction DR1 and N pads may be arranged along the second direction DR2.

FIG. 5B shows that the alignment area ALA (see FIG. 5B) is disposed in the Mth row (hereinafter, the row in the detailed description means that it is parallel to the second direction DR2). However, the alignment area ALA of FIG. 5C need not be disposed in the Mth row. More specifically, the alignment area ALA may be arranged in at least one of the second to M−1th rows. The outermost pads among the plurality of pads PD all may be the second pads PD2. The alignment area ALA may be surrounded by the connection area CNA. Specifically, all areas adjacent to the alignment area ALA may be the connection area CNA.

If the alignment area ALA is not defined at the outermost, the alignment measurement may be easier. More specifically, in the case where the base layer SUB (see FIG. 3) includes at least one plastic film, the base layer SUB (see FIG. 3) may be bent in the process of mounting the driving chip IC (see FIG. 3). In the second row to the M−1th row where the alignment area ALA is arranged, no bending may occur, and thus, alignment measurement may be easier.

In addition, the alignment area ALA may be arranged in at least one column among the second column to the N−1th column. Even in this case, no bending may occur in the second column to the N−1th column, and thus, alignment measurement may be easier.

Figure 5D:
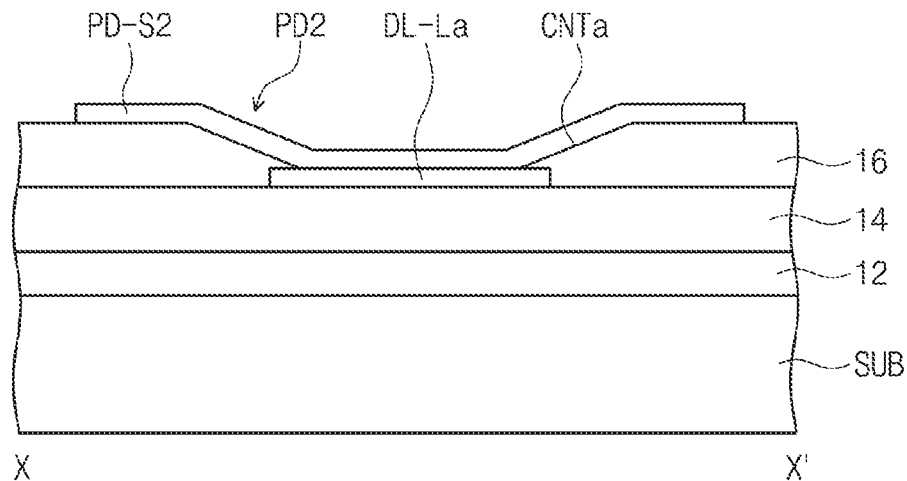
FIG. 5D is a sectional view taken along a line X-X' of FIG. 5B.
Figure 5D:
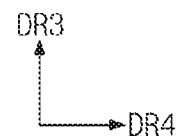
Figure 5E:
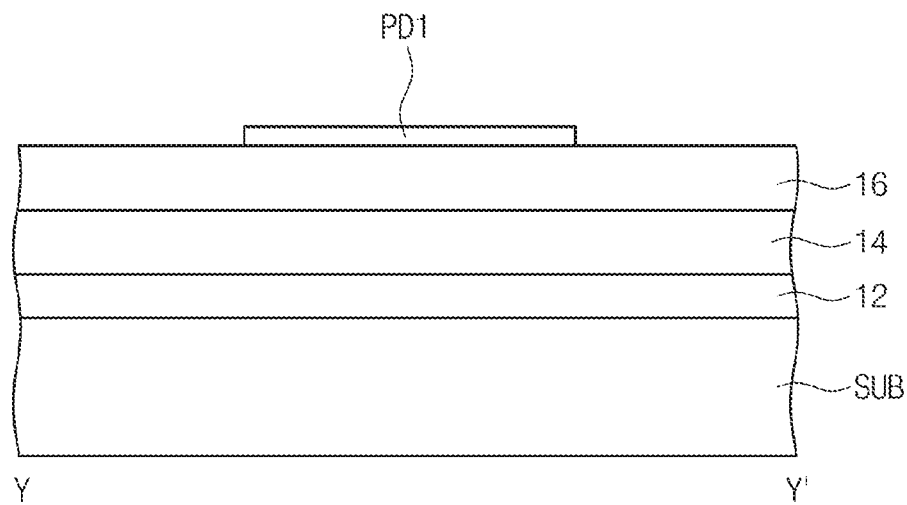
FIG. 5E is a sectional view taken along a line Y-Y' of FIG. 5B.
Figure 5E:
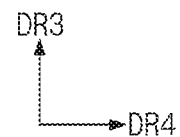
Figure 5F:
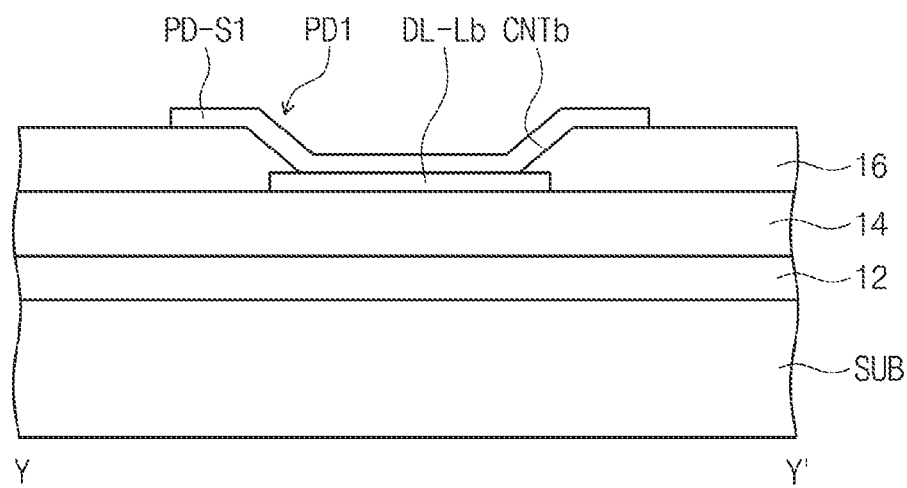
FIG. 5F is a sectional view taken along a line Y-Y' of FIG. 5B.
Figure 5F:
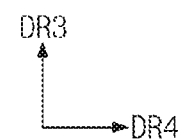

FIG. 5D is a sectional view taken along a line X-X' of FIG. 5B. FIG. 5E and FIG. 5F are sectional views taken along a line Y-Y' of FIG. 5B. FIGS. 5D to 5F are sectional views taken along a fourth direction DR4 parallel to the long side direction of the pads PD (see FIG. 5B). That is, FIGS. 5D to 5F are sectional views defined by the fourth direction DR4 and the third direction DR3.

In FIG. 5D, the second pad PD2 may include a plurality of layers. For example, the second pad PD2 may include a first sub-pad layer DL-La and a second sub-pad layer PD-S2. The first sub-pad layer DL-La may extend from the data wiring part DL-L (see FIG. 4A). That is, the first sub-pad layer DL-La may be disposed on the same layer as the data wiring part DL-L (see FIG. 4A). The second sub-pad layer PD-S2 may be connected to the first sub-pad layer DL-La through a first contact hole CNTa. The first contact hole CNTa penetrates the third insulation layer 16.

Although FIG. 5D shows that the second pad PD2 is composed of two layers, the inventive concept is not limited thereto. For example, the second pad PD2 may be composed of a single layer or may be formed of three or more layers.

FIG. 5E shows a sectional view of the first pad PD1. The first pad PD1 may be electrically separated from the circuit layer DP-CL (see FIG. 3). That is, the first pad PD1 may be a floating pattern.

The first pad PD1 may be disposed on the same layer as the second sub-pad layer PD-S2 of the second pad PD2 described above with reference to FIG. 5D. For example, in this exemplary embodiment, the first pad PD1 and the second sub-pad layer PD-S2 may be disposed on the third insulation layer 16. Although FIG. 5E shows that the first pad PD1 is composed of a single layer, the inventive concept is not limited thereto. For example, the first pad PD1 may be composed of a plurality of layers.

In FIG. 5F, the first pad PD1 may include a plurality of layers. For example, the first pad PD1 may include a first sub-pad layer DL-Lb and a second sub-pad layer PD-S1. The first sub-pad layer DL-Lb may extend from the data wiring part DL-L (see FIG. 4A). That is, the first sub-pad layer DL-Lb may be disposed on the same layer as the data wiring part DL-L (see FIG. 4A). The second sub-pad layer PD-S1 may be connected to the first sub-pad layer DL-Lb through a second contact hole CNTb. The second contact hole CNTb penetrates the third insulation layer 16.

FIGS. 5D and 5F show that a first pad PD1 and a second pad PD2 may include first sub-pad layers DL-La and DL-Lb, respectively, which extend from the data wiring part DL-L. However, an exemplary embodiment of the inventive concept may include the wires shown in FIG. 4A, or pads electrically connected to the sensing wires included in the touch sensing unit in addition to the data wiring part DL-L. For example, it is described that the first pad and the second pad are electrically connected to a wire (e.g., a gate wire) disposed on the first insulation layer 12, and include a sub-pad layer disposed on the first insulation layer 12. In this case, the uppermost layer (e.g., a sub-pad layer disposed on the third insulation layer 16) of the first and second pads may be electrically connected to the sub-pad layer through a contact hole (not shown) penetrating the second insulation layer 14 and the third insulation layer 16.

FIG. 5G is a sectional view illustrating a state in which a pad part and a driving chip are coupled to each other.

FIG. 5G is a sectional view of a connection area CNA and an alignment area ALA. More specifically, it is a sectional view illustrating a state in which corresponding chip pads IP are coupled to the second pad PD2 of FIG. 5D and the first pad PD1 of FIG. 5E.

In the connection area CNA, the second pad PD2 and the chip pad IP of the driving chip IC may be coupled by an anisotropic conductive film EM. In the alignment area ALA, the first pad PD1 and the chip pad IP of the driving chip IC may be coupled by an anisotropic conductive film EM. However, the inventive concept is not limited thereto, and the second pad PD2 and the chip pad IP of the driving chip IC, and the first pad PD1 and the chip pad IP of the driving chip IC may be bonded through a solder bump.

In relation to the fourth direction DR4, the length of the second pad PD2 is greater than that of the first pad PD1. When viewed from the third direction DR3, the chip pad IP coupled with the second pad PD2 may be hidden by the second pad PD2 and thus, may be invisible. However, the chip pad IP coupled with the first pad PD1 has a length in the fourth direction DR4 greater than that of the first pad PD1. Therefore, when viewed from the third direction DR3, the position of the chip pad IP coupled with the first pad PD1 may be checked.

Figure 6:
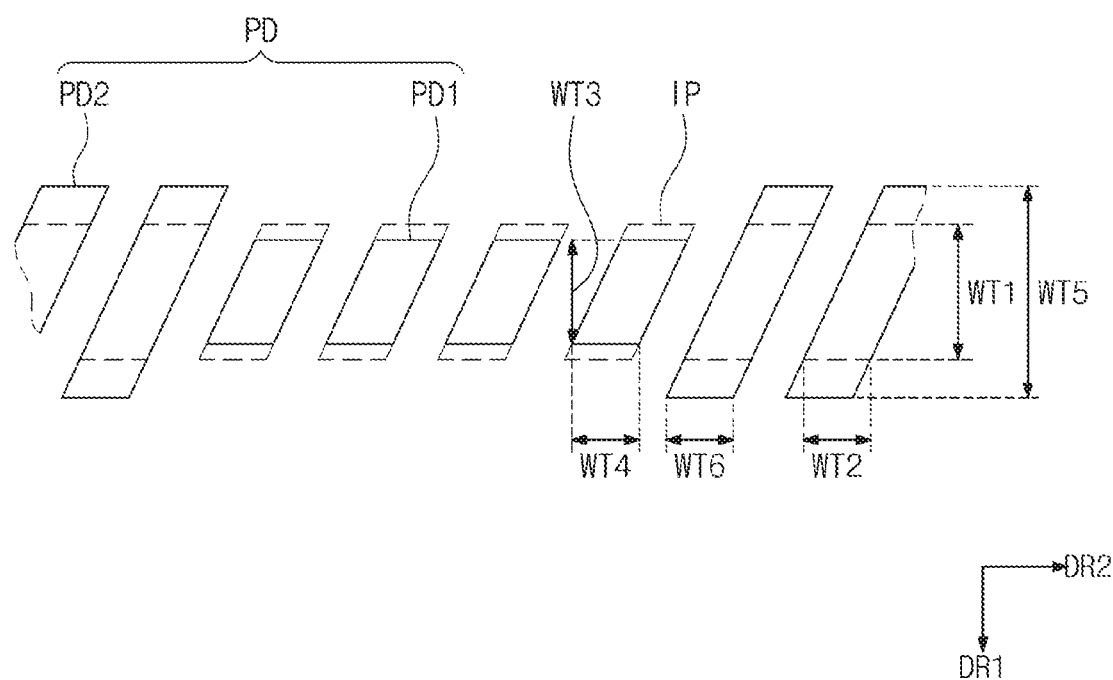
FIG. 6 is an enlarged plan view illustrating a part of a display device according to an exemplary embodiment of the inventive concept.

FIG. 6 is an enlarged plan view illustrating a part of a display device according to an exemplary embodiment of the inventive concept.

Referring to FIG. 6, a first pad PD1 and a second pad PD2 are shown by solid lines, and a chip pad IP is shown by a dotted line.

In FIG. 6, the second width WT2 of the chip pad IP, the fourth width WT4 of the first pad PD1, and the sixth width WT6 of the second pad PD2 may be equal to each other. The third width WT3 of the first pad PD1 may be less than the first width WT1 of the chip pad IP and the fifth width WT5 of the second pad PD2. The first width WT1 of the chip pad IP may be greater than the third width WT3 of the first pad PD1 and less than the fifth width WT5 of the second pad PD2. The fifth width WT5 of the second pad PD2 may be greater than the first width WT1 of the chip pad IP and the third width WT3 of the first pad PD1.

Figure 7A:
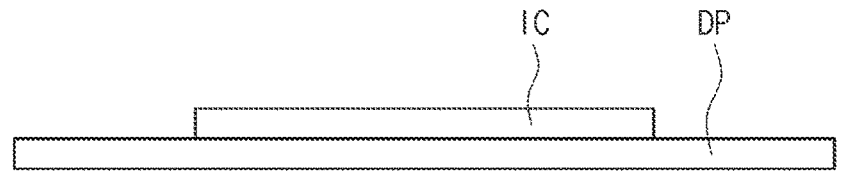
FIG. 7A and FIG. 7B are schematic views illustrating an alignment measurement method.
Figure 7A:
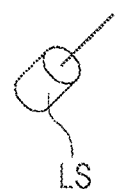
Figure 7A:
Figure 7A:
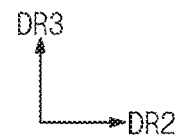
Figure 7B:
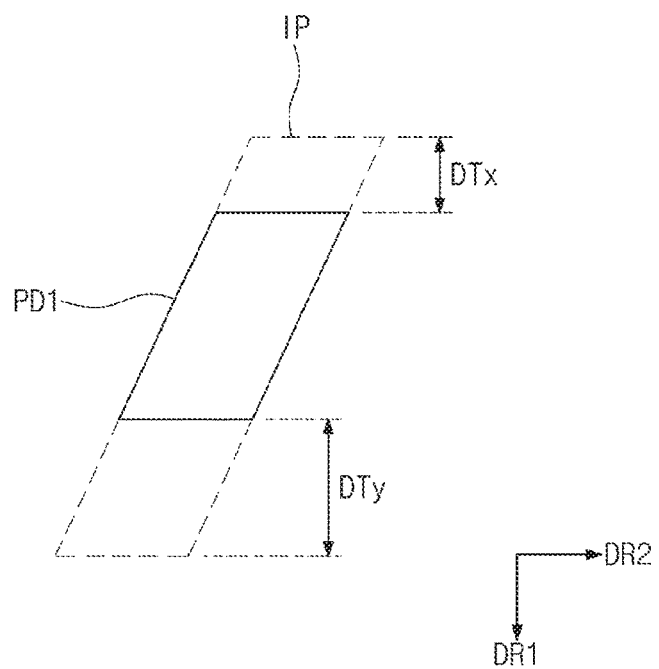

According to an exemplary embodiment of the inventive concept, the width of the exposed chip pad IP may be measured in order to easily measure whether the position of the chip pad IP corresponds to a range within an alignment margin. FIGS. 7A and 7B are schematic views illustrating an alignment measurement method.

FIGS. 7A and 7B illustrate an example of checking whether the driving chip IC is properly aligned on the display panel DP. Since the driving chip IC is opaque, it is difficult to confirm whether or not the alignment of the driving chip IC is correct on the upper surface of the display panel DP. Therefore, it is possible to test whether or not the driver IC is properly aligned under the display panel DP.

Light is emitted to the back surface of the display panel DP by using a light source LS under the display panel DP. The light emitted on the back surface of the display panel DP may be reflected and incident to a measurement device MS. For example, the measurement device MS may be a device, such as a camera, for photographing the back surface of the display panel DP. Since the base layer SUB (see FIG. 3) of the display panel DP is transparent, alignment may be measured on the back surface of the display panel DP.

FIG. 7B shows one chip pad IP and one first pad PD1 taken by the measurement device MS. Since the area of the first pad PD1 is less than the chip pad IP, the chip pad IP exposed to the periphery of the first pad PD1 may be observed.

According to an exemplary embodiment of the inventive concept, the width of the exposed chip pad IP may be measured in order to easily measure whether the difference in width corresponds to a range within an alignment margin. For example, the width of the exposed chip pad IP is measured based on the first pad PD1. In FIG. 7B, the width of the chip pad IP exposed to one side of the first pad PD1 is measured as a first width DTx, and the width of the chip pad IP1 exposed to the other side of the first pad PD1 is measured as a second width DTy.

It is possible to measure whether a difference between a value obtained by dividing the sum of the first width DTx and the second width (DTy) by two and the first width DTx and a difference between a value obtained by dividing the sum of the first width DTx and the second width DTy by two and the second width DTy correspond to a range within a predetermined alignment margin.

According to an exemplary embodiment of the present invention, it is possible to easily measure the width of the chip pad IP exposed based on the first pad PD1 through the rear surface of the display panel DP. Therefore, the defect detection test process may be simplified, and the quality may be easily checked. As a result, the manufacturing yield and product reliability may be improved.

Figure 8A:
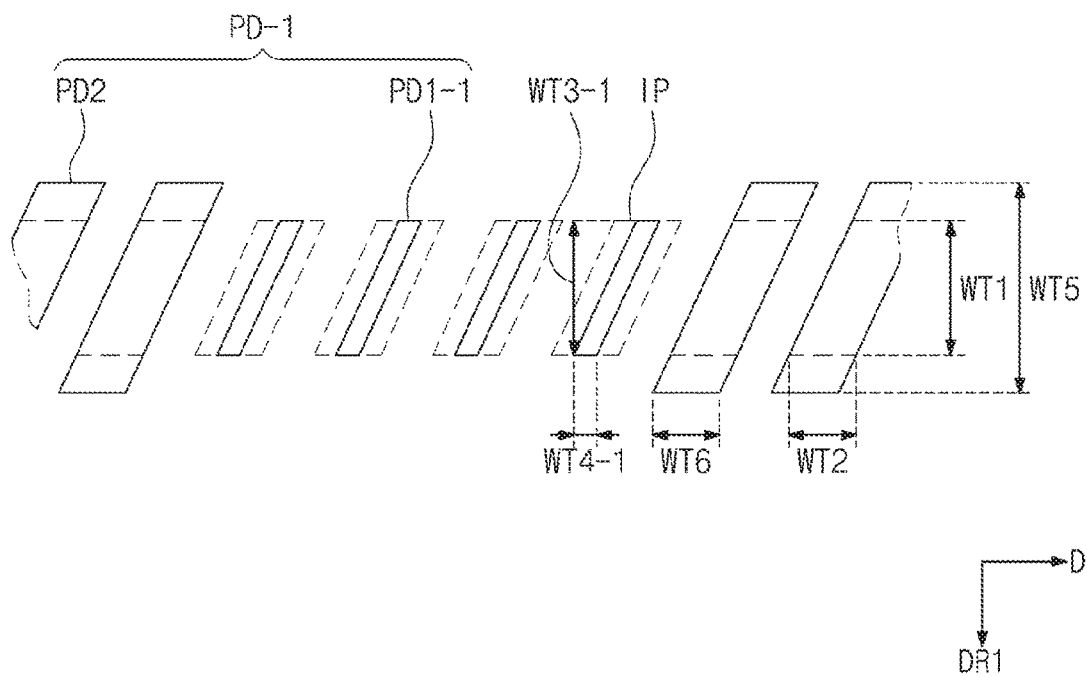
FIG. 8A is an enlarged plan view illustrating a part of a display device according to an exemplary embodiment of the inventive concept.

FIG. 8A is an enlarged plan view illustrating a part of a display device.

Referring to FIG. 8A, pads PD-1 are shown by solid lines, and a chip pad IP is shown by a dotted line.

The first width WT1 of the chip pad IP and the third width WT3-1 of the first pad PD1-1 may be equal to each other. The fifth width WT5 of the second pad PD2 may be larger than the first width WT1 of the chip pad IP and the third width WT3-1 of the first pad PD1.

The fourth width WT4-1 of the first pad PD1-1 may be less than the second width WT2 of the chip pad IP. Therefore, the chip pad IP exposed in the second direction DR2 with respect to the first pad PD1-1 may be measured to determine whether the alignment is correct.

Figure 8B:
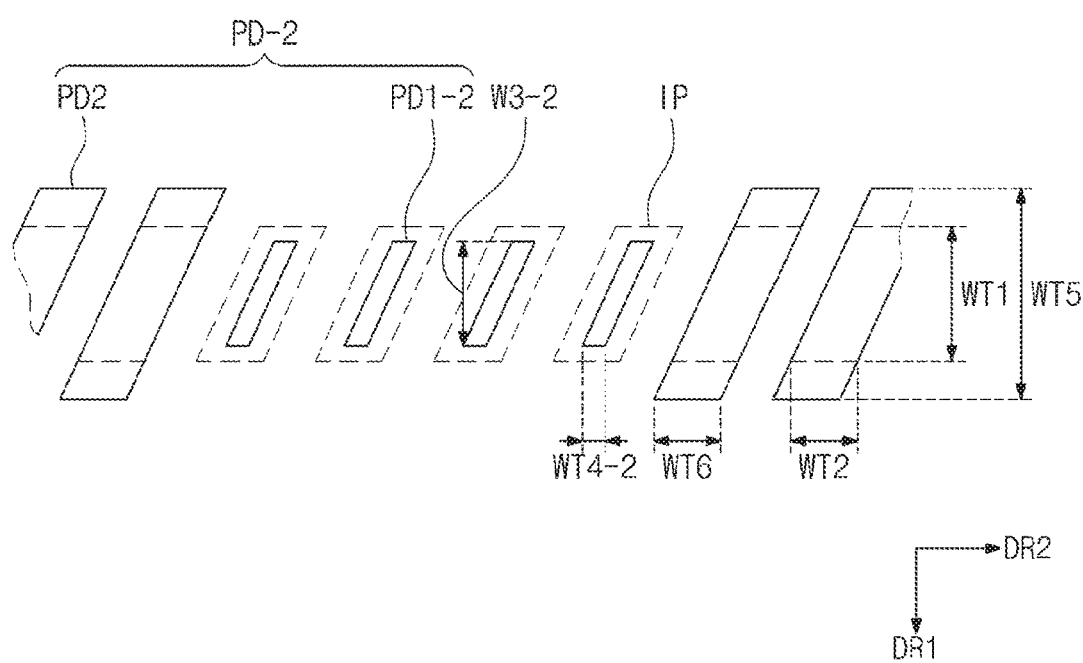
FIG. 8B is an enlarged plan view illustrating a part of a display device according to an exemplary embodiment of the inventive concept.

FIG. 8B is an enlarged plan view illustrating a part of a display device.

Referring to FIG. 8B, pads PD-2 are shown by solid lines, and a chip pad IP is shown by a dotted line.

The third width WT3-2 of the first pad PD1-2 is less than the first width WT1 of the chip pad IP and the fourth width WT4-2 of the first pad PD1-2 is less than the second width WT2 of the chip pad IP. Therefore, the chip pad IP exposed in the first direction DR1 and the second direction DR2 are measured based on the first pad PD1-2 in order to measure whether the alignment is correct.

Figure 8C:
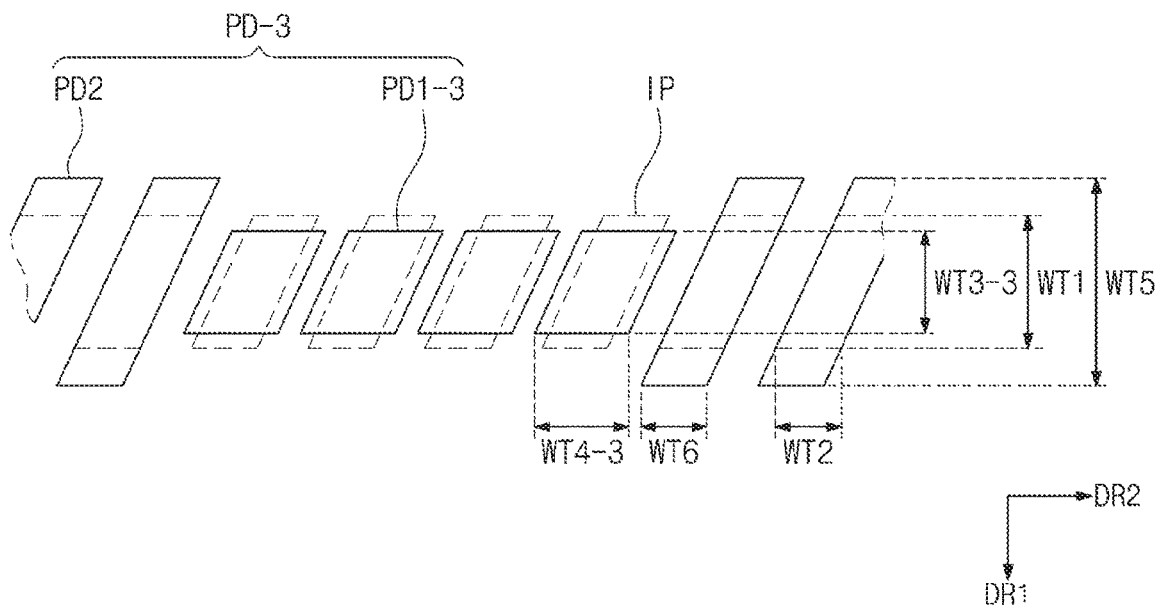
FIG. 8C is an enlarged plan view illustrating a part of a display device according to an exemplary embodiment of the inventive concept.

FIG. 8C is an enlarged plan view illustrating a part of a display device.

Referring to FIG. 8C, pads PD-3 are shown by solid lines, and a chip pad IP is shown by a dotted line.

The third width WT3-3 of the first pad PD1-3 may be less than the first width WT1 of the chip pad IP and the fifth width WT5 of the second pad PD2. The fourth width WT4-3 of the first pad PD1-3 may be greater than the second width WT2 of the chip pad IP. The chip pad IP exposed in the first direction DR1 with respect to the first pad PD1-3 may be measured to determine whether the alignment is correct.

Figure 8D:
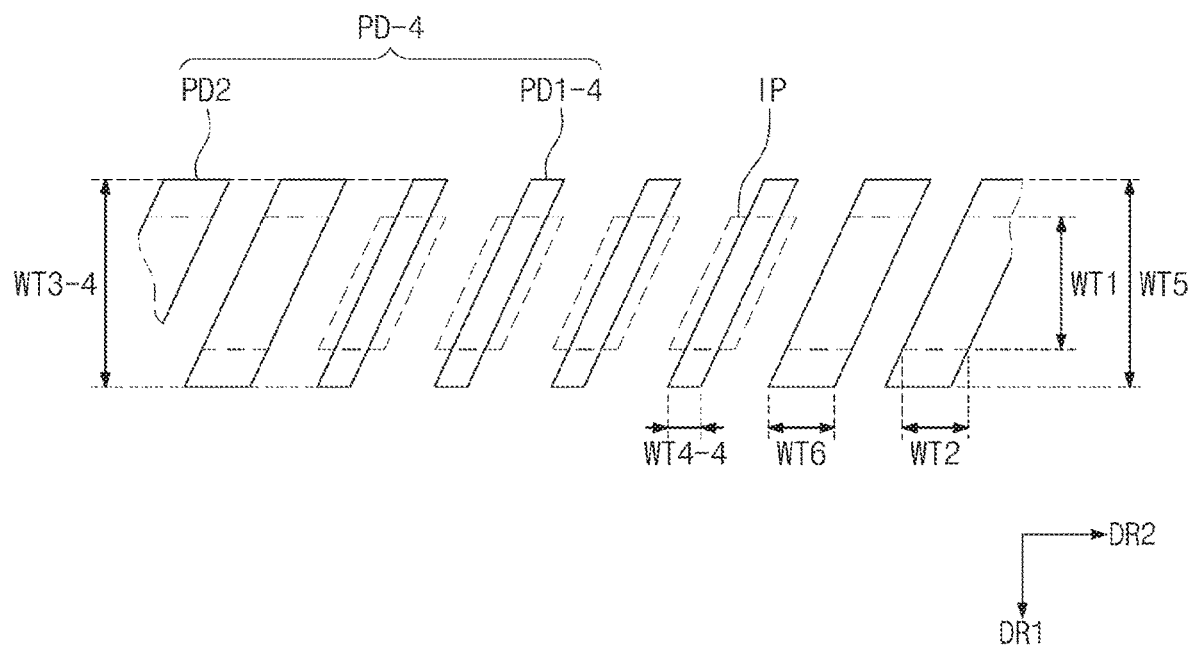
FIG. 8D is an enlarged plan view illustrating a part of a display device according to an exemplary embodiment of the inventive concept.

FIG. 8D is an enlarged plan view illustrating a part of a display device.

Referring to FIG. 8D, pads PD-4 are shown by solid lines, and a chip pad IP is shown by a dotted line.

The third width WT3-4 of the first pad PD1-4 is equal to the fifth width WT5 of the second pad PD2 and is greater than the first width WT1 of the chip pad IP. The fourth width WT4-4 of the first pad PD1-4 may be greater than the second width WT2 of the chip pad IP. The chip pad IP exposed in the second direction DR2 with respect to the first pad PD1-4 may be measured to determine whether the alignment is correct.

FIG. 9A is a plan view of a pad part according to an exemplary embodiment of the inventive concept.

Referring to FIG. 9A, the first pad part PAD1-2 may include a plurality of pads PD-5. The plurality of pads PD-5 may all have a rectangular shape.

The pads PD-5 may include a first pad PD1-5 and a second pad PD2-1. The first pad PD1-5 may be disposed in the alignment area ALA and the second pad PD2-1 may be disposed in the connection area CNA.

Although it is shown in FIG. 9A that all pads arranged at the outermost among the plurality of pads PD-5 are the second pads PD2-1, the first pad PD1-5 and the second pad PD2-1 among the plurality of pads PD-5 may be disposed at the outermost.

Figure 9B:
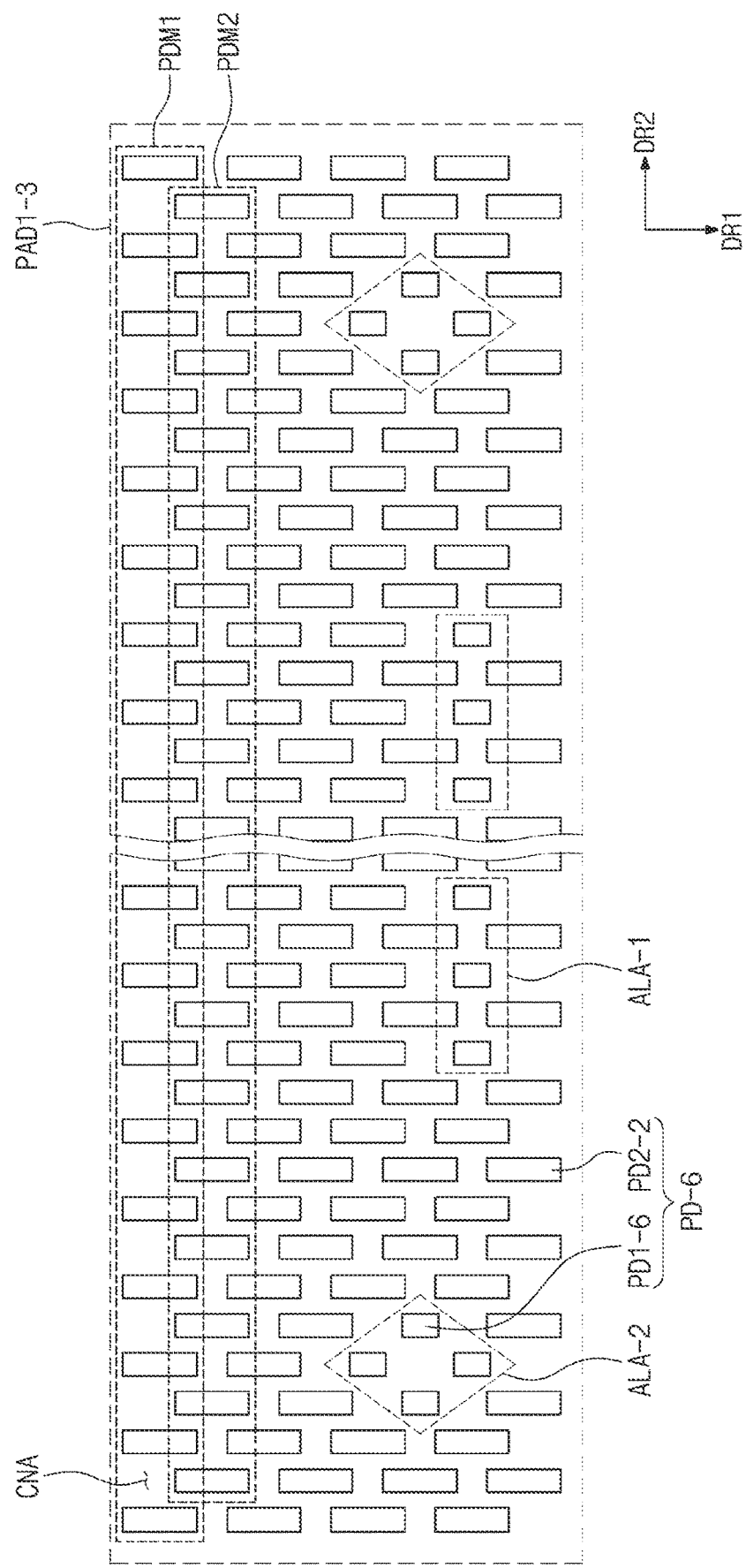
FIG. 9B is a plan view of a pad part according to an exemplary embodiment of the inventive concept.

FIG. 9B is a plan view of a pad part according to an exemplary embodiment of the inventive concept.

Referring to FIG. 9B, the first pad part PAD1-3 may include a plurality of pads PD-6. The plurality of pads PD-6 may be defined by first-row pads PDM1, which are arranged along the second direction DR2, and second-row pads PDM2, which are arranged along the second direction DR2 and partially overlap the first-row pads PDM1 in the second direction DR2. The first-row pads PDM1 and the second-row pads PDM2 may be alternately arranged sequentially along the first direction DR1.

The first-row pads PDM1 and the second-row pads PDM2 may not overlap each other in the first direction DR1. One first-row pad PDM1 and one second-row pad PDM2 may be alternately arranged along the second direction DR2.

The pads PD-6 may include a first pad PD1-6 and a second pad PD2-2. The first pad PD1-6 is arranged in a first alignment area ALA-1 or a second alignment area ALA-2 and the second pad PD2-2 is arranged in the connection area CNA.

Although the first alignment area ALA-1 and the second alignment area ALA-2 are shown in FIG. 9B, any one of the first alignment area ALA-1 and the second alignment area ALA-2 may be omitted.

The first pad PD1-6 disposed in the first alignment area ALA-1 may be arranged to be parallel along the second direction DR2. The first pad PD1-6 disposed in the second alignment area ALA-2 may be arranged in a diamond shape. The arrangement form of the first pad PD1-6 is exemplarily shown but may be modified to different forms other than the shown arrangement form.

According to an embodiment of the inventive concept, the size of a pad of a display panel for measuring the alignment is smaller than the size of a chip pad of a driving chip. Therefore, it is possible to easily check whether a driving chip is properly aligned on a display panel on the rear surface facing the upper surface of the display panel where the driving chip is mounted.

Although certain exemplary embodiments and implementations have been described herein, other embodiments and modifications will be apparent from this description. Accordingly, the inventive concept is not limited to such embodiments, but rather to the broader scope of the presented claims and various obvious modifications and equivalent arrangements.

What is claimed is:

1. A display device comprising:
   a display panel comprising a base layer, a circuit layer disposed on the base layer, and a pad part comprising a plurality of pads disposed on the base layer; and
   a driving chip disposed on the pad part and comprising a plurality of chip pads,
   wherein:
   the plurality of pads comprise:
      a first pad; and
      a second pad electrically connected to the circuit layer; and
   a length of a first chip pad corresponding to the first pad among the plurality of chip pads is greater than a length of the first pad in a plan view.

2. The display device of claim 1, wherein the plurality of pads are arranged in an M×N matrix form, where each of M and N are integers of 1 or more.

3. The display device of claim 2, wherein the first pad is disposed in an area in which a second row to an M–1th row and a second column to an N–1 column overlap.

4. The display device of claim 1, wherein the second pad has an area equal to or greater than an area of a corresponding a second chip pad among the plurality of chip pads.

5. The display device of claim 1, wherein:
   the first chip pad has a first width in a first direction defining the length of the first chip pad and a second width in a second direction intersecting the first direction;
   the first pad has a third width in the first direction defining the length of the first pad and a fourth width in the second direction; and
   the first width is greater than the third width.

6. The display device of claim 5, wherein the second width is equal to the fourth width.

7. The display device of claim 5, wherein the second width is less than the fourth width.

8. The display device of claim 1, wherein each of the plurality of pads has a parallelogram shape.

9. The display device of claim 1, wherein each of the chip pads has a rectangular shape.

10. The display device of claim 1, wherein the base layer comprises a transparent flexible substrate.

11. The display device of claim 1, wherein the first pad is electrically separated from the circuit layer.

12. The display device of claim 1, wherein the first pad is electrically connected to the circuit layer.

13. The display device of claim 1, wherein at least one alignment area is defined in the pad part and the first pad is disposed in the at least one alignment area.

14. The display device of claim 13, further comprising a plurality of the first pads and the second pads, and the first pads are disposed in the alignment area and the second pads are disposed in a periphery of the alignment area.

15. A display device comprising:
a display panel comprising a plurality of pads arranged in an M×N matrix form, where each of M and N are integers of 1 or more; and
a driving chip comprising a plurality of chip pads electrically coupled with the plurality of pads,
wherein:
the plurality of pads comprise first pads and second pads;
a length of a first chip pad corresponding to each of the first pads among the plurality of chip pads is greater than a length of each of the first pads in a plan view, and the second pads have an area equal to or greater than an area of a corresponding second chip pad among the plurality of chip pads.

16. The display device of claim 15, wherein the second pads are disposed in a first row, an Mth row, a first column, and an Nth column, and the first pads and the second pads are disposed in an area in which a second row to an M−1th row and a second column to an N−1th column overlap.

17. The display device of claim 15, wherein:
the first chip pad has a first width in a first direction defining the length of the first chip pad and a second width in a second direction intersecting the first direction;
each of the first pads has a third width in the first direction defining the length of each of the first pads and a fourth width in the second direction;
the first width is greater than the third width, and the second width is equal to or less than the fourth width.

18. A display device comprising:
a base layer;
a circuit layer disposed on the base layer;
a pad part electrically connected to the circuit layer, disposed on the base layer, and comprising at least one alignment area and a connection area defined on a flat surface; and
a driving chip disposed on the pad part and comprising a plurality of chip pads electrically connected to the circuit layer through the pad part,
wherein:
the pad part comprises first pads disposed in the alignment area and second pads disposed in the connection area; and
a length of a first chip pad corresponding to the first pads among the plurality of chip pads is greater than a length of each of the first pads in a plan view.

19. The display device of claim 18, wherein the alignment area is defined as being surrounded by the connection area.

20. The display device of claim 18, wherein:
the first chip pad has a first width in a first direction defining the length of the first chip pad and a second width in a second direction intersecting the first direction;
each of the first pads has a third width in the first direction defining the length of each of the first pads and a fourth width in the second direction;
the first width is greater than the third width; and
the second width is equal to or less than the fourth width.

21. The display device of claim 1, wherein a length of the second pad is greater than a length of the first pad in a plan view.

* * * * *